(12) United States Patent
Gion

(10) Patent No.: US 6,873,186 B2
(45) Date of Patent: Mar. 29, 2005

(54) LEVEL SHIFT CIRCUIT

(75) Inventor: Masahiro Gion, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/862,584

(22) Filed: Jun. 8, 2004

(65) Prior Publication Data

US 2005/0007148 A1 Jan. 13, 2005

(30) Foreign Application Priority Data

Jul. 11, 2003 (JP) ........................................ 2003-273548
Dec. 5, 2003 (JP) ........................................ 2003-408078

(51) Int. Cl.[7] ........................................ H03K 19/0175
(52) U.S. Cl. ........................................ 326/68; 326/62
(58) Field of Search ........................ 326/62, 63, 64, 326/68, 81, 83, 84

(56) References Cited

U.S. PATENT DOCUMENTS

| | | | |
|---|---|---|---|
| 5,675,278 A | | 10/1997 | Tanaka et al. |
| 5,748,026 A | * | 5/1998 | Maekawa et al. ............ 327/333 |
| 5,825,229 A | * | 10/1998 | Manaresi et al. ............ 327/333 |
| 6,081,131 A | * | 6/2000 | Ishii ............................. 326/68 |
| 6,452,418 B1 | * | 9/2002 | Singh et al. .................. 326/68 |
| 6,476,637 B1 | | 11/2002 | Brownlow et al. |
| 6,483,345 B1 | * | 11/2002 | Whittaker et al. ............ 326/62 |
| 6,600,338 B1 | * | 7/2003 | Nguyen et al. ............... 326/68 |
| 6,617,878 B2 | * | 9/2003 | Brownlow et al. ........... 326/68 |
| 6,806,734 B2 | * | 10/2004 | Cairns et al. ................. 326/68 |

FOREIGN PATENT DOCUMENTS

JP    6-209256    7/1994

* cited by examiner

*Primary Examiner*—Michael Tokar
*Assistant Examiner*—Linh V Nguyen
(74) *Attorney, Agent, or Firm*—McDermott Will & Emery LLP

(57) ABSTRACT

In a level shift circuit, for example, when an input signal IN changes from the L level to the H level, an N-type signal input transistor is made conducting and current flows in the N-type transistor. Accordingly, a first current mirror circuit amplifies the current flowing in the N-type transistor by predetermined number of times, increases the current driving capability for an inverted output node, and changes the inverted output node quickly to the L level. With the change to the L level of the inverted output node, an output node changes to the H level, a P-type transistor (first current interrupting circuit) is made non-conducting by the change, and the current fed from the first current mirror circuit is interrupted. Therefore, even when the power source voltage for the input signal and the inverted input signal is lowered, the operation is performed at high speed.

20 Claims, 29 Drawing Sheets

LEVEL SHIFT CIRCUIT

BACKGROUND OF THE INVENTION

The present invention relates to a level shift circuit used for an interface between circuits with different power source voltages.

As processing is becoming finer in recent years, there has been a tendency toward reducing the power source voltage of circuits in semiconductor integrated circuits for the sake of device reliability. On the other hand, devices used in a system such as electronic equipment include a device operated on the conventional power source voltage. To interface between the devices and the semiconductor integrated circuit using different power source voltages, generally, a level shift circuit is provided in the semiconductor integrated circuit.

Recently, also in a semiconductor integrated circuit, an optimum power source voltage is supplied to each of circuit blocks in order to reduce power consumption. To interface among the circuit blocks of different power source voltages, a level shift circuit is also used. It is expected that importance of the level shift circuit is increasing in future.

A conventional level shift circuit is disclosed in, for example, Japanese Unexamined Patent Publication No. Hei 6-209256. FIG. 29 shows an example of such a conventional level shift circuit. Shown in the diagram are N-type transistors 1 and 2, P-type transistors 3 and 4, a high voltage power source VDD, a ground power source VSS, an input signal IN, an inverted input signal XIN, an output signal OUT, and an inverted output signal XOUT. To the gate electrodes of the N-type transistors 1 and 2, the input signal IN and the inverted input signal XIN are input, respectively. The source electrodes of the N-type transistors 1 and 2 are connected to the ground power source VSS. The drain electrodes of the P-type transistors 3 and 4 are connected to the drain electrodes of the N-type transistors 1 and 2, and the source electrodes of the P-type transistors 3 and 4 are connected to the high voltage power source VDD. The P-type transistors 3 and 4 are cross-coupled in such a manner that the gate electrode of one of the P-type transistors 3 and 4 is connected to the drain electrode of the other transistor. The inverted output signal XOUT is output from the connection point between the P-type transistor 3 and the N-type transistor 1, and the output signal OUT is output from the connection point between the P-type transistor 4 and the N-type transistor 2.

The operation of the conventional level shift circuit will now be described. As an example, the operation will be described on assumption that the amplification level of the input signal IN and the inverted input signal XIN is 1.5V, the power source potential of the high voltage power source VDD is 3V, the potential of the ground power source VSS is 0V, and the amplitude level of the output signal OUT and the inverted output signal XOUT is 3V.

First, it is assumed that, as the initial state, the input signal IN is 0V, the inverted input signal XIN is 1.5V, the output signal OUT is 0V, and the inverted output signal XOUT is 3V. At this time, the N-type transistor 1 and the P-type transistor 4 are in a non-conducting state, and the N-type transistor 2 and the P-type transistor 3 are in a conducting state.

The case where the input signal IN changes to 1.5V and the inverted input signal XIN changes to 0V will now be considered. By the change, the N-type transistor 1 shifts to the conducting state, and the N-type transistor 2 shifts to the non-conducting state. Since the P-type transistor 3 is in the conducting state at this time, the potential of the inverted output signal XOUT decreases to an intermediate value determined by the ratio between conduction resistance values of the N-type transistor 1 and the P-type transistor 3. When the intermediate value exceeds the threshold voltage of the P-type transistor 4, the P-type transistor 4 shifts to the conducting state to increase the potential of the output signal OUT. When the potential of the output signal OUT rises, the P-type transistor 3 shifts to the non-conducting state, so that the conduction resistance value of the P-type transistor 3 rises and the potential of the inverted output signal XOUT further decreases.

Due to such positive feedback, the output signal OUT changes to 3V and the inverted output signal XOUT changes to 0V, thereby completing the operation of shifting the input signal of the low amplitude level to the output signal of the high amplitude level. Therefore, for example, a signal of a low power source voltage level in the semiconductor integrated circuit can be shifted to an outside signal of a high power source voltage level.

It was, however, found that when the power source voltage decreases more in the conventional level shift circuit, the following problems become conspicuous. Specifically, in the level shift circuit shown in FIG. 29, a transistor of a high withstand voltage and having a thick gate oxide film so as to withstand a high voltage is used as each of the N-type transistors 1 and 2. Generally, the transistor of a high withstand voltage has a large threshold voltage (for example, 0.5V). Consequently, when the voltage level (power source voltage level) of the input signal IN and the inverted input signal XIN drops close to the threshold voltage (for example, 0.7V) of the N-type transistors 1 and 2, the capability of the N-type transistors 1 and 2 for receiving the signal IN and XIN by their gate electrodes sharply deteriorates. As a result, when the signals IN and XIN change from 0V to the predetermined voltage level (0.7V), the operation of the N-type transistors 1 and 2 on the side of shifting to the conducting state is slow, and a problem occurs such that the operation speed of the level shift circuit as a whole deteriorates.

As described above, there is a tendency that the power source voltage in the semiconductor integrated circuit is becoming lower as microfabrication advances in recent years. Consequently, as the level of the voltage further decreases, it is becoming an important issue to shift a signal of the low voltage level to a signal of the high voltage level at speed as high as possible.

SUMMARY OF THE INVENTION

An object of the invention is to provide a level shift circuit for shifting an input signal of a low voltage level to an output signal of a high voltage level, in which even the voltage level of an input signal further decreases, the level of the signal can be shifted at high speed, preferably, with lower power consumption.

To achieve the object, in the invention, attention is paid to a current mirror circuit for amplifying current. By amplifying current flowing in a transistor having a gate electrode to which an input signal is supplied by the predetermined number of times by the current mirror circuit, the speed of the operation is increased. Further, in the case of employing the current mirror circuit in the invention, a measure is taken so that reduction in the current consumption is not disturbed by stationary current flowing in the current mirror circuit.

Concretely, the invention provides a level shift circuit having a pair of an input terminal and an inverted input terminal and a pair of an output node and an inverted output node, for receiving an input signal and an inverted input signal by the input terminal and the inverted input terminal, for shifting an amplitude level of the input signal and the inverted input signal to a higher amplitude level, and for transmitting an output signal having the shifted amplitude level and an inverted output signal obtained by inverting the output signal to the output node and the inverted output node, respectively, comprising: a first N-type signal input transistor having a gate electrode to which the input terminal is connected; a second N-type signal input transistor having a gate electrode to which the inverted input terminal is connected; a first current mirror circuit disposed between the first N-type transistor and the inverted output node, for amplifying current flowing in the first N-type transistor by predetermined number of times, and drawing out the amplified current from the inverted output node; and a second current mirror circuit disposed between the second N-type transistor and the output node, for amplifying current flowing in the second N-type transistor by predetermined number of times, and drawing out the amplified current from the output node.

In the level shift circuit according to the invention, each of the first and second current mirror circuits has at least a pair of a P-type current mirror circuit constructed by P-type transistors and an N-type current mirror circuit constructed by N-type transistors, the P-type and N-type current mirror circuits being cascaded.

Further, the level shift circuit according to the invention is characterized by further including: a first current interrupting circuit connected to the first current mirror circuit, for interrupting the current fed from the first current mirror circuit after completion of a change in the output signal; and a second current interrupting circuit connected to the second current mirror circuit, for interrupting the current fed from the second current mirror circuit after completion of a change in the inverted output signal.

In addition, in the level shift circuit according to the invention, the first current interrupting circuit is constructed by a P-type transistor for receiving the output signal by its gate electrode; and the second current interrupting circuit is constructed by a P-type transistor for receiving the inverted output signal by its gate electrode.

The level shift circuit according to the invention is characterized by further including: a first change speed accelerating circuit connected in parallel with the P-type current mirror circuit of the first current mirror circuit, for accelerating speed of a change from the L level to the H level of the inverted output signal under control of the inverted output signal of the inverted output node; and a second change speed accelerating circuit connected in parallel with the P-type current mirror circuit of the second current mirror circuit, for accelerating speed of a change from the L level to the H level of the output signal under control of the output signal of the output node.

Further, in the level shift circuit according to the invention, the first change speed accelerating circuit comprises: a first P-type transistor connected in parallel with the P-type current mirror circuit of the first current mirror circuit; and a first buffer circuit whose output side is connected to the gate electrode of the first P-type transistor and which is controlled by an inverted output signal of the inverted output node, and the second change speed accelerating circuit includes: a second P-type transistor connected in parallel with the P-type current mirror circuit of the second current mirror circuit; and a second buffer circuit whose output side is connected to the gate electrode of the second P-type transistor and which is controlled by an output signal of the output node.

In addition, in the level shift circuit according to the invention, the first change speed accelerating circuit further comprises a first control circuit for allowing operation of the first buffer circuit to be performed after a change in the output signal of the output node is finished, and the second change speed accelerating circuit further comprises a second control circuit for allowing operation of the second buffer circuit to be performed after a change in the inverted output signal of the inverted output node is finished.

The level shift circuit according to the invention is characterized by further including a stabilizing circuit for determining and stabilizing a potential state of the output node and the inverted output node early in an initial state in which a power source starts to be supplied.

Further, in the level shift circuit according to the invention, the stabilizing circuit has: a first N-type transistor whose gate electrode is connected to the output node, whose drain electrode is connected to the inverted output node, and whose source electrode is grounded; and a second N-type transistor whose gate electrode is connected to the inverted output node, whose drain electrode is connected to the output node, and whose source electrode is grounded.

In addition, in the level shift circuit according to the invention, at least one of an output signal of the output node and an inverted output signal of the inverted output node is output to the outside.

The invention also provides a level shift circuit having a pair of an input terminal and an inverted input terminal and a pair of an output node and an inverted output node, for receiving an input signal and an inverted input signal by the input terminal and the inverted input terminal, for shifting an amplitude level of the input signal and the inverted input signal to a higher amplitude level, and for transmitting an output signal having the shifted amplitude level and an inverted output signal obtained by inverting the output signal to the output node and the inverted output node, respectively, comprising: a first N-type signal input transistor having a gate electrode to which the input terminal is connected; a second N-type signal input transistor having a gate electrode to which the inverted input terminal is connected; a first current mirror circuit having at least a set of a P-type current mirror circuit constructed by P-type transistors and an N-type current mirror circuit constructed by N-type transistors, the P-type and N-type current mirror circuits being cascaded, disposed between the first N-type transistor and the inverted output node, for amplifying current flowing in the first N-type transistor by predetermined number of times, and drawing out the amplified current from the inverted output node; a second current mirror circuit having at least a set of a P-type current mirror circuit constructed by P-type transistors and an N-type current mirror circuit constructed by N-type transistors, the P-type and N-type current mirror circuits being cascaded, disposed between the second N-type transistor and the output node, for amplifying current flowing in the second N-type transistor by predetermined number of times, and drawing out the amplified current from the output node; a first N-type current feedback transistor connected in parallel with the first N-type signal input transistor and controlled by a potential at a connection point between the P-type current mirror circuit and the N-type current mirror circuit in the first current mirror circuit; and a second N-type current feedback transistor connected in parallel with the second N-type signal input transistor and controlled by a potential at a connection point between the P-type current mirror circuit and the N-type current mirror circuit in the second current mirror circuit.

Further, the level shift circuit according to the invention is characterized by further comprising: a third N-type transistor whose gate electrode is connected to the inverted input terminal, whose drain electrode is connected to the connection point between the p-type current mirror circuit and the N-type current mirror circuit in the first current mirror circuit, and whose source electrode is grounded; and a fourth N-type transistor whose gate electrode is connected to the input terminal, whose drain electrode is connected to the connection point between the P-type current mirror circuit and the N-type current mirror circuit in the second current mirror circuit, and whose source electrode is grounded.

In addition, the level shift circuit according to the invention is characterized by further comprising: a first current interrupting circuit connected to the first current mirror circuit, for interrupting the current fed from the first current mirror circuit after completion of a change in the output signal; and a second current interrupting circuit connected to the second current mirror circuit, for interrupting the current fed from the second current mirror circuit after completion of a change in the inverted output signal.

In the level shift circuit according to the invention, the first current interrupting circuit is constructed by a P-type transistor for receiving the output signal by its gate electrode; and the second current interrupting circuit is constructed by a P-type transistor for receiving the inverted output signal by its gate electrode.

The level shift circuit according to the invention is characterized by further comprising: a first change speed accelerating circuit connected in parallel with the P-type current mirror circuit of the first current mirror circuit, for accelerating speed of a change from the L level to the H level of the inverted output signal under control of the inverted output signal of the inverted output node; and a second change speed accelerating circuit connected in parallel with the P-type current mirror circuit of the second current mirror circuit, for accelerating speed of a change from the L level to the H level of the output signal under control of the output signal of the output node.

In the level shift circuit according to the invention, the first change speed accelerating circuit comprises: a first P-type transistor connected in parallel with the P-type current mirror circuit of the first current mirror circuit; and a first buffer circuit whose output side is connected to the gate electrode of the first P-type transistor and which is controlled by an inverted output signal of the inverted output node, and the second change speed accelerating circuit includes: a second P-type transistor connected in parallel with the P-type current mirror circuit of the second current mirror circuit; and a second buffer circuit whose output side is connected to the gate electrode of the second P-type transistor and which is controlled by an output signal of the output node.

In addition, in the level shift circuit according to the invention, the first change speed accelerating circuit further comprises a first control circuit for allowing operation of the first buffer circuit to be performed after a change in the output signal of the output node is finished and the second change speed accelerating circuit further comprises a second control circuit for allowing operation of the second buffer circuit to be performed after a change in the inverted output signal of the inverted output node is finished.

The level shift circuit according to the invention is characterized by further comprising a stabilizing circuit for determining and stabilizing a potential state of the output node and the inverted output node early in an initial state in which a power source starts to be supplied.

In the level shift circuit according to the invention, the stabilizing circuit has: a first N-type transistor whose gate electrode is connected to the output node, whose drain electrode is connected to the inverted output node, and whose source electrode is grounded; and a second N-type transistor whose gate electrode is connected to the inverted output node, whose drain electrode is connected to the output node, and whose source electrode is grounded.

In the level shift circuit according to the invention, at least one of an output signal of the output node and an inverted output signal of the inverted output node is output to the outside.

According to the invention, for example, when an input signal of an input terminal changes from the L level to the H level, a first N-type transistor is made conducting, current flows in the transistor, the current is amplified by predetermined number of times by a first current mirror circuit, and the amplified current is output from an inverted output node. Consequently, the current driving capability for the inverted output node increases, the speed of a change to the L level of the inverted output node and a change to the H level of the output node is increased, and the operation speed of the level shift circuit improves.

Particularly, in the invention, after the first current mirror circuit amplifies the current by the predetermined number of times, in a stationary state in which the input signal maintains at the H level, although the first current mirror circuit always passes the current amplified by the predetermined number of times, after completion of the change to the H level of the output signal of the output node, the first current interrupting circuit operates to interrupt the amplified current fed from the first current mirror circuit. Thus, power consumption can be effectively reduced.

In the invention, for example, when the output signal changes from the L level to the H level in the output node, the second change speed accelerating circuit accelerates the speed of the change to the H level of the output signal. Consequently, the operation speed is further increased.

Further, in the invention, in the initial state where a power source starts to be supplied, even in the case where the input signal and the inverted input signal of the input terminal and the inverted input signal are not at a predetermined L or H level and are indeterminate, the stabilizing circuit operates to determine the potential of each of the output node and the inverted output node to the L or H level early. Therefore, transient current which flows until the signals enter a stable state is effectively reduced.

In addition, in the invention, for example, when the input signal of the input terminal changes from the L level to the H level, the first N-type transistor is made conducting, current flows in the transistor, and the current is amplified by predetermined number of times by the first current mirror circuit. Further, a first N-type current feedback transistor and an N-type transistor as a component of the N-type current mirror of the first current mirror circuit construct another current mirror circuit. The another current mirror circuit amplifies the amplified current. The amplified current is amplified again by the first current mirror circuit. The operation is repeated, and the amplified current is drawn out from the inverted output node. Therefore, the current driving capability for the inverted output node remarkably improves. The speed of the change to the L level of the inverted output node and the change to the H level of the output node is increased, and the operation speed of the level shift circuit increases.

Particularly, in the invention, for example, when the input signal of the input terminal is at the L level, inherently, current does not flow in the first current mirror circuit. When the amount of leak current is large, the current mirror circuit including the first N-type current feedback transistor amplifies the leak current, and the inverted input signal of the inverted input terminal tends to become the L level erroneously. The third N-type transistor leads the leak current to the ground, so that such erroneous operation can be prevented.

In the invention, in a stationary state in which the input signal maintains the H level after the first current mirror circuit amplifies the current by the predetermined number of times as described above, the first current mirror circuit always passes the current amplified by the predetermined number of times. However, after the change to the H level of the output signal of the output node is finished, the first current interrupting circuit operates to interrupt the amplified current fed from the first current mirror circuit. Thus, power consumption can be effectively reduced.

Further, in the invention, for example, when the output signal changes from the L level to the H level at the output node, the second change speed accelerating circuit accelerates the speed of the change to the H level of the output signal, so that the operation speed further improves.

In addition, in the invention, in the initial state where the power source starts to be supplied, even in the case where the input signal and the inverted input signal of the input terminal and the inverted input terminal are not at the predetermined L or H level but are indeterminate, the stabilizing circuit operates to determine the potential of each of the output node and the inverted output node to the L or H level early and stabilize it. Consequently, transient current which flows until the stable state is obtained can be effectively reduced.

DETAILED DESCRIPTION OF THE INVENTION

Preferred embodiments of the invention will be described hereinbelow with reference to the appended drawings.

Embodiment 1

Figure 1:
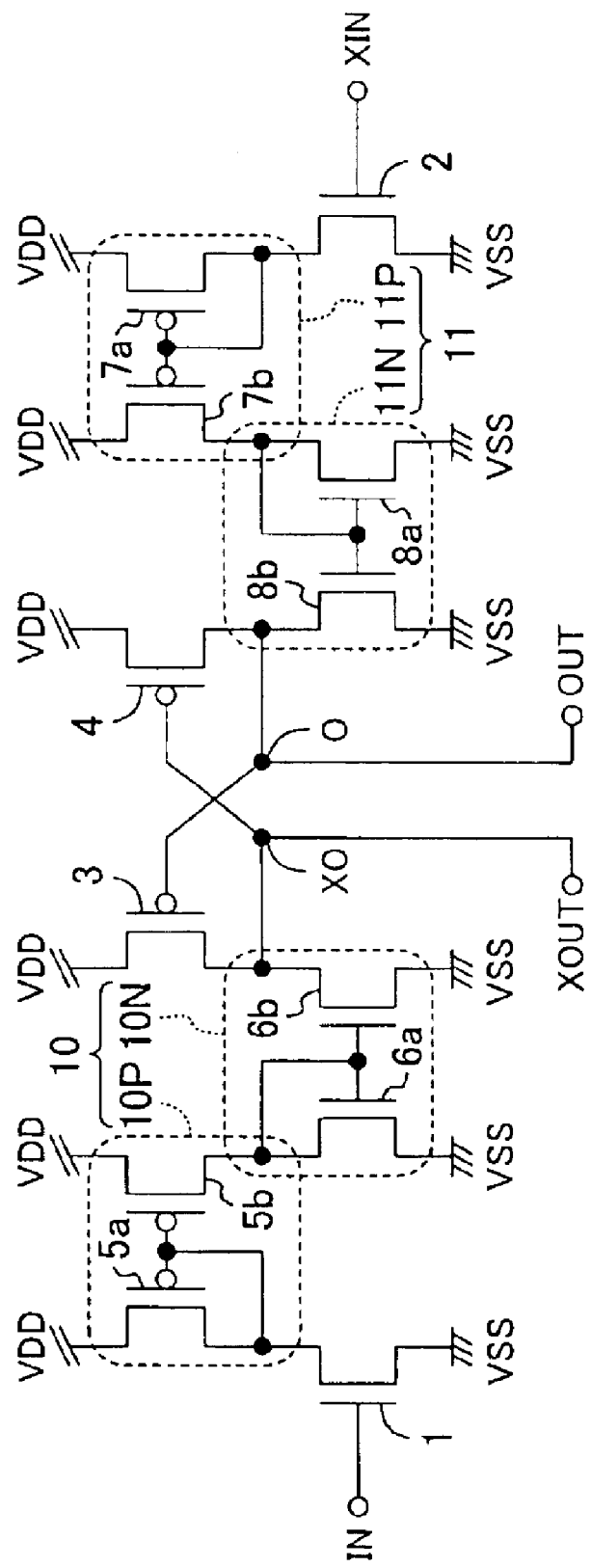
FIG. 1 is a diagram showing the configuration of a level shift circuit of a first embodiment of the invention.

FIG. 1 shows a level shift circuit of a first embodiment of the invention.

Shown in the diagram are a high voltage power source VDD, a ground power source VSS, an input terminal IN, an inverted input terminal XIN, an output node O, an inverted output node XO, an output terminal OUT connected to the output node O, and an inverted output terminal XOUT connected to the inverted output node XO. It is not always necessary to provide a pair of the output terminal OUT and the inverted output terminal XOUT. It is sufficient to provide either the terminal OUT or XOUT as necessary.

Reference numeral 1 denotes a first N-type signal input transistor and an input signal (to which the same reference characters "IN" as those of the input terminal IN are designated) of the input terminal IN is input to the gate electrode of the first N-type transistor 1. Reference numeral 2 denotes a second N-type signal input transistor and an inverted input signal (to which the same reference characters "XIN" as those of the inverted input terminal XIN are designated) of the inverted input terminal XIN is input to the gate electrode of the second N-type transistor 2. The source electrodes of the transistors 1 and 2 are connected to the ground power source VSS.

Further, reference numerals 3 and 4 denote first and second P-type transistors whose source electrodes are connected to the high voltage power source VDD and are cross-coupled in such a manner that the gate electrode of one of the P-type transistors 3 and 4 is connected to the drain electrode of the other P-type transistor. The drain electrode of the first P-type transistor 3 serves as the inverted output node XO, and the drain electrode of the second P-type transistor 4 serves as the output node O.

The invention is characterized in that a first current mirror circuit 10 is disposed between the drain electrode of the first N-type signal input transistor 1 and the inverted output node XO (that is, the drain electrode of the first P-type transistor 3). Similarly, a second current mirror circuit 11 is disposed between the drain electrode of the second N-type signal input transistor 2 and the output node O (that is, the drain electrode of the second P-type transistor 4).

The first current mirror circuit 10 is obtained by cascading a P-type current mirror circuit 10P having two P-type transistors 5a and 5b and an N-type current mirror circuit 10N having two N-type transistors 6a and 6b. In the P-type current mirror circuit 10P, the source electrodes of the two P-type transistors 5a and 5b are connected to the high voltage power source VDD, the gate electrodes are connected to each other and are connected to the drain electrode of the P-type transistor 5a and, further, this drain electrode is connected to the drain electrode of the first N-type signal input transistor 1. In the P-type current mirror circuit 10P, when gate width, gate length, and flowing current in the P-type transistor 5a are W1, L1, and i1, respectively, and gate width, gate length, and flowing current of the other P-type transistor 5b are W2, L2, and i2, respectively, the current i2 flowing in the other P-type transistor 5b is expressed by the following equation.

$$i2 = i1 * (W2/L2)/(W1/L1)$$

The current i2 is equal to the predetermined number a of times as large as the current i1 ($\alpha=(W2/L2)/(W1/L1)$). For example, when L1=L2=0.4 μm, W=1 μm, and W2=10 μm the current i2 flowing in the other P-type transistor 5b is ten times as large as the current i1 flowing in the P-type transistor 5a. The current i2 is output from the drain electrode of the other P-type transistor 5b.

On the other hand, in the N-type current mirror circuit 10N of the first current mirror circuit 10, the source electrodes of the two N-type transistors 6a and 6b are connected to the ground power source VSS and the gate electrodes of the N-type transistors 6a and 6b are connected to each other. Further, the drain electrode of the N-type transistor 6a is connected to the drain electrode of the other P-type transistor 5b of the P-type current mirror circuit 10P. Also in the N-type current mirror circuit 10N, in a manner similar to the above, according to the settings of the gate widths W1 and W2 and the gate lengths L1 and L2 of the N-type transistors 6a and 6b, the current i2 flowing in the other N-type transistor 6b becomes the predetermined number β of times as large as the current i1 flowing in the N-type transistor 6a on the basis of the equation ($\beta=(W2/L2)/(W1/L1)$).

Similarly, the second current mirror 11 is obtained by cascading a P-type current mirror circuit 11P having two P-type transistors 7a and 7b and an N-type current mirror circuit 11N having two N-type transistors 8a and 8b. Since the internal configurations of the P-type and N-type current mirror circuits 11P and 11N are similar to those of the P-type and N-type current mirror circuits 10P and 10N of the first current mirror circuit 10, repetitive description will not be given.

The operation of the level shift circuit of the embodiment will now be described. The operation will be described on assumption that the amplitude level of each of the input signal IN and the inverted input signal XIN is 0.7V, the power source potential of the high voltage power source VDD is 3V, the potential of the ground power source VSS is 0V, and the amplitude level of each of the output signal O and the inverted output signal XO is 3V.

First, as an initial state, it is assumed that the input signal IN is 0V, the inverted input signal XIN is 0.7V, the output signal O is 0V, and the inverted output signal XO is 3V. At this time, the first N-type transistor 1 and the second P-type transistor 4 for signal input are in a non-conducting state. On the other hand, the second N-type transistor 2 and the first P-type transistor 3 for signal input are in a conducting state.

A case where the input signal IN changes to 0.7V and the inverted input signal XIN changes to 0V will now be considered. By the potential change, the first N-type signal input transistor 1 shifts to the conducting state, and the second N-type signal input transistor 2 shifts to the non-conducting state. At this time, current is passed to the first N-type signal input transistor 1 and the current is amplified by the predetermined number α of times ($\alpha=(W2/L2)/(W1/L1)$) by the P-type current mirror circuit 10P in the first current mirror circuit 10. Since the P-type transistor 3 is in the conducting state, the amplified current is further amplified by the predetermined number β of times ($\beta=(W2/L2)/(W1/L1)$) by the N-type current mirror circuit 10N. The amplified current of the total predetermined number α×β of times is drawn out from the inverted output node XO and is grounded via the other N-type transistor 6b of the N-type current mirror circuit 10N. Therefore, when the voltage of the input signal IN is low as 0.7V, the current driving capability of the first N-type signal input transistor 1 deteriorates. Although the current flowing in the transistor 1 is small, the drive current to the inverted output node XO is made a large value, so that the potential can be changed quickly from the H level to the L level of the inverted output node XO.

When the potential of the inverted output node XO decreases to an intermediate value determined by the ratio of the conduction resistance values of the N-type transistor 6b of the N-type current mirror circuit 10N and the first P-type transistor 3 by the large drive current from the inverted output node XO and the time until the intermediate value exceeds the threshold voltage of the second P-type transistor 4 is shortened, the second P-type transistor 4 shifts to the conducting state at this time point. Consequently, the potential of the output node O also rises fast. By the potential rise of the output node O, the first P-type transistor 3 quickly shifts to the non-conducting state, so that a conduction resistance value of the first P-type transistor 3 also increases quickly, and the potential of the inverted output node XO decreases quickly. By such positive feedback, the potential of the inverted output node XO changes to 0V, and the potential of the output node O changes to 3V, and the operation of shifting the input signals IN and XN of the low amplification level (0.7V) to the output signal O and the inverted output signal XO of the amplitude level (3V) is completed.

The operation performed at the time of a change of rise of the input signal IN has been described above as an example. The operation performed at the time of a change of rise of the inverted input signal XIN is similar to the above, so that repetitive description will not be given.

In the level shift circuit of the embodiment, even if the voltage of each of the input signal IN and the inverted input signal XIN decreases, since the current driving capability for the output node O and the inverted output node is increased by using the current mirror circuits 10 and 11, a change speed of the output signal O and the inverted output signal XO is increased, thereby enabling high-speed operation to be assured.

In the embodiment, the output terminal OUT and the inverted output terminal XOUT are connected to the output node O and the inverted output node XO, respectively, and both the output signal O and the inverted output signal XO are output to the outside. The invention is not limited to the configuration but, obviously, a configuration of outputting only one of the out signal O and the inverted output signal XO to the outside may be also employed.

Although each of the first and second current mirror circuits 10 and 11 is formed by a pair of one P-type current mirror circuit and one N-type current mirror circuit in the embodiment, obviously, a plurality of pairs may be provided.

Embodiment 2

Figure 3:
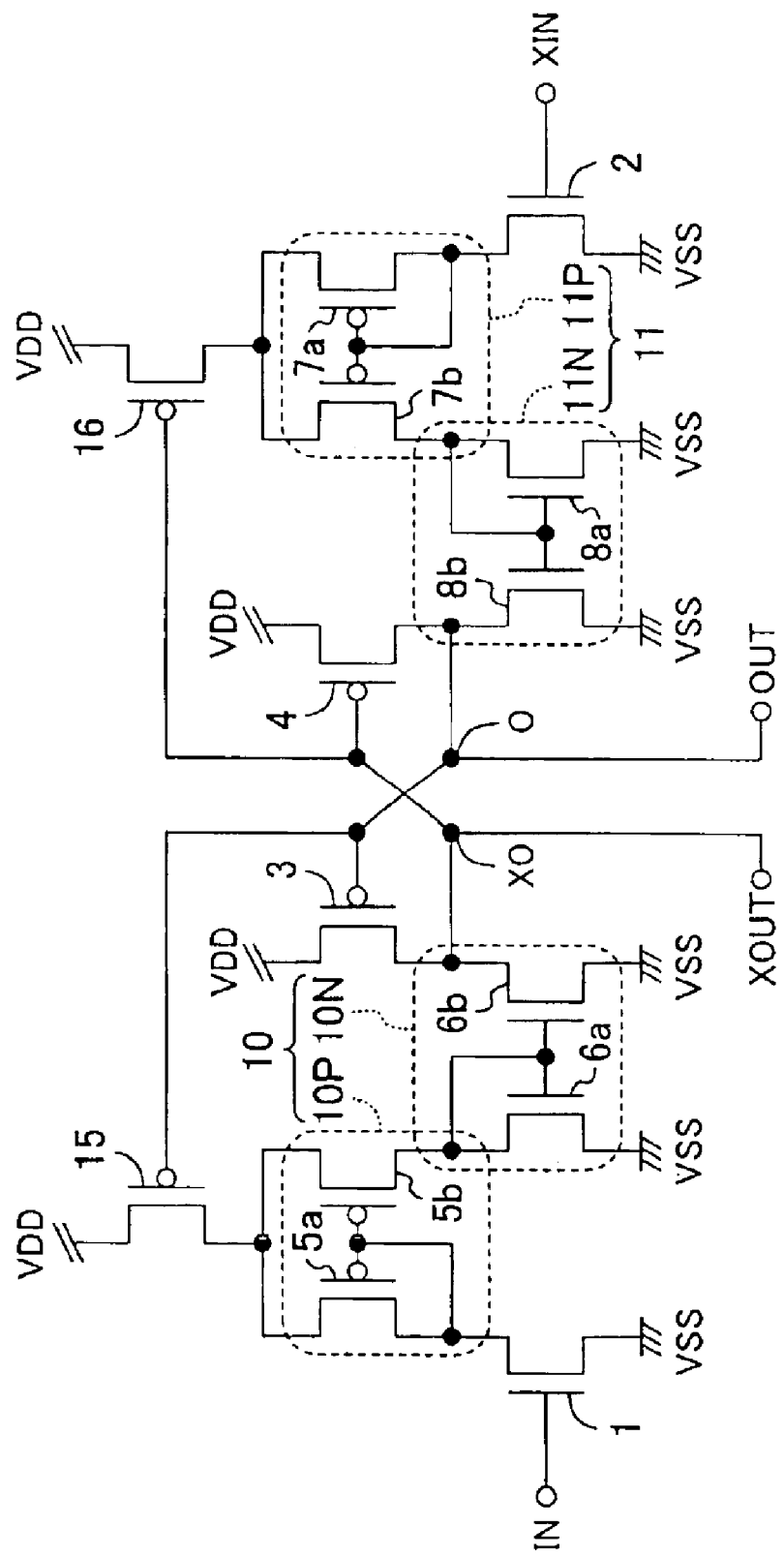
FIG. 3 is a diagram showing the configuration of a level shift circuit of a second embodiment of the invention.

FIG. 3 shows a level shift circuit of a second embodiment of the invention.

The level shift circuit of the diagram is obtained by improving the level shift circuit of the first embodiment to reduce the current steadily flowing in the first and second current mirror circuits 10 and 11.

Specifically, the level shift circuit of FIG. 3 is obtained by adding two P-type transistors 15 and 16 to the configuration of the level shift circuit of the first embodiment. In the P-type transistor 15, the source electrode is connected to the high voltage source VDD, the drain electrode is connected to the P-type current mirror circuit 10P in the first current mirror circuit 10, and the gate electrode is connected to the output node O and receives the output signal O. Similarly, in the other P-type transistor 16, the source electrode is connected to the high voltage source VDD, the drain electrode is connected to the P-type current mirror circuit 11P of the second current mirror circuit 11, and the gate electrode is connected to the inverted output node XO and receives the inverted output signal XO.

The P-type transistor 15 is made non-conducting on completion of a change from the L level to the H level of the potential of the output node O and functions as a first current interrupting circuit for interrupting the current path between the high voltage source VDD and the P-type current mirror circuit 10P of the first current mirror circuit 10 and interrupting the current fed from the first current mirror 10. Similarly, the other P-type transistor 16 is made non-conducting on completion of a change from the L level to the H level of the potential of the inverted output node XO and functions as a second current interrupting circuit for interrupting the current path between the high voltage source VDD and the P-type current mirror circuit 11P of the second current mirror circuit 11 and interrupting the current fed from the second current mirror circuit 11.

The operation of the embodiment will now be described. First, the basic operation will be described by using FIG. 2 in which the two P-type transistors 15 and 16 as a feature of the second embodiment are not provided.

Figure 2:
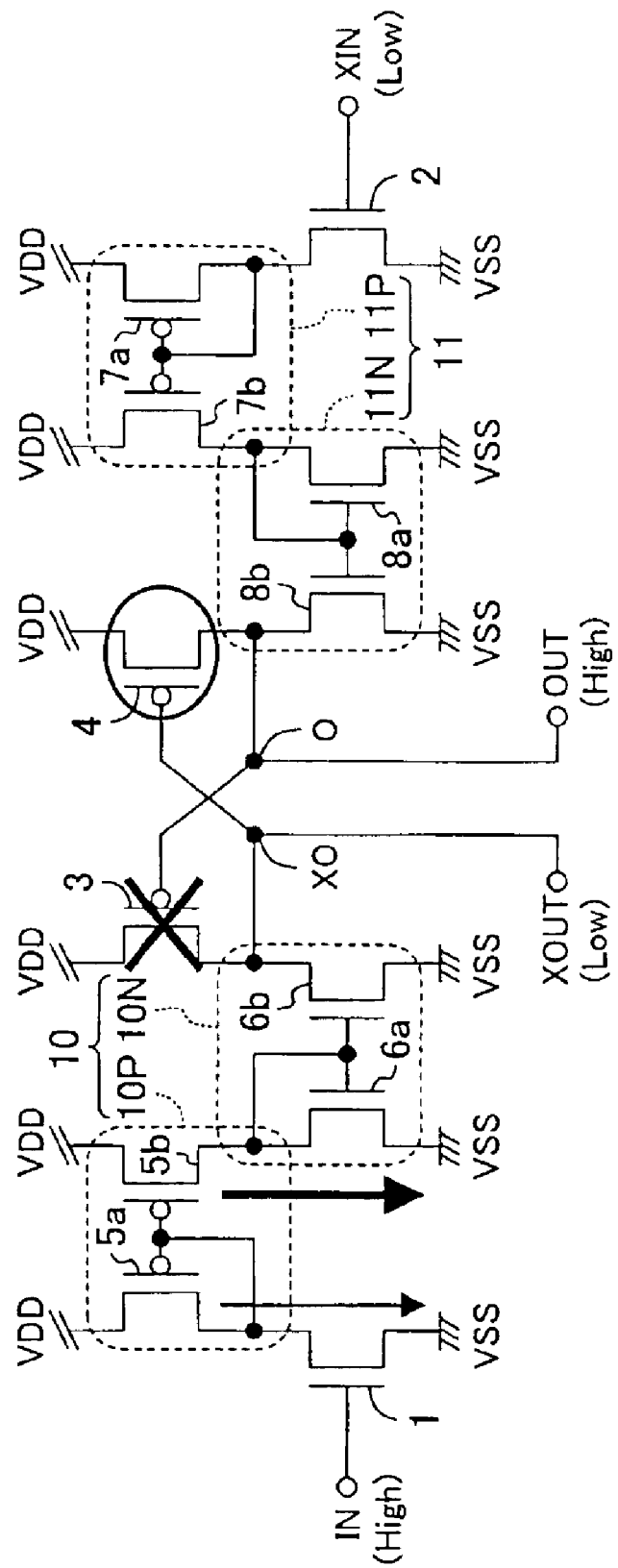
FIG. 2 is a diagram showing operation of the level shift circuit.

FIG. 2 shows the case where, for example, the input signal IN is at the H level and the inverted input signal XIN is at the L level. In this case, the output node O is at the H level, the inverted output node XO is at the L level, the first P-type transistor 3 is in the non-conducting state, and the second P-type transistor 4 is in the conducting state. Since the input signal IN is at the H level, the first N-type signal input transistor 1 is made conducting. In the first current mirror circuit 10, current flows from the P-type transistor 5a in the P-type current mirror circuit 10P via the first N-type signal input transistor 1 as shown by a thin arrow in the diagram. Amplified current also flows from the other P-type transistor 5b via the N-type transistor 6a of the N-type current mirror circuit 10N as shown by a thick arrow. Since the first P-type transistor 3 is in the non-conducting state, the amplified current via the other N-type transistor 6b does not flow in the N-type current mirror circuit 10N. On the other hand, since the inverted input signal XIN is at the L level and the second N-type signal input transistor 2 is in the non-conducting state, the second current mirror circuit 11 does not operate and the amplified current does not flow. Therefore, in the level shift circuit of FIG. 2, in the steady state in which the input signal IN is at the H level, the P-type current mirror circuit 10P in the first current mirror circuit 10 uselessly passes the stationary current.

Figure 4:
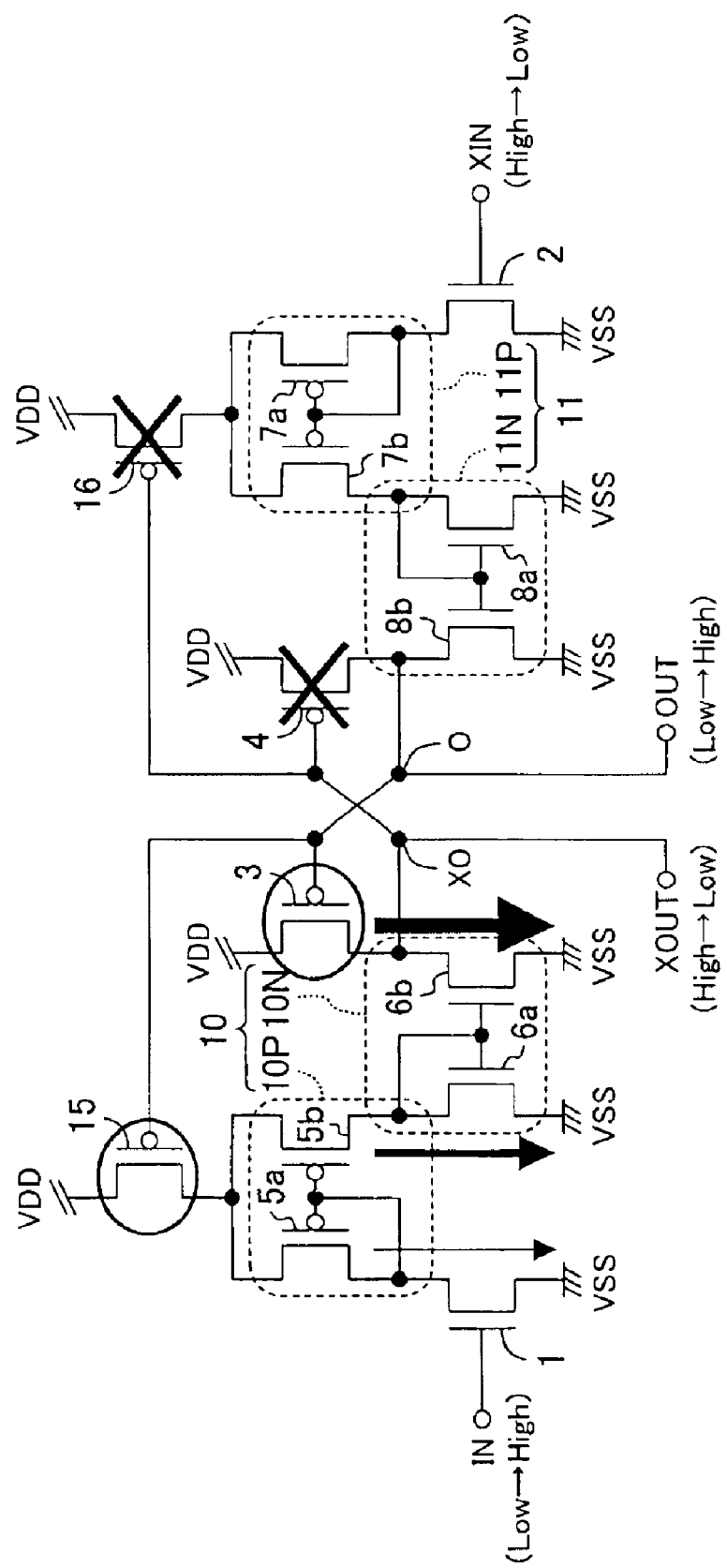
FIG. 4 is a diagram showing operation at transient time in which an input signal changes to the H level and an inverted input signal changes to the L level in the level shift circuit.

In contrast, in the level shift circuit shown in FIG. 3, such stationary current can be interrupted as will be described in detail hereinbelow. A case where the input signal IN is at the H level like the above-described case will be described. As shown in FIG. 4, first, when the input signal IN is at the L level before it changes to the H level, the output node O is at the L level, and the inverted output node XO is at the H level. Accordingly, the first P-type transistor 3 is in the conducting state and the second P-type transistor 4 is in the non-conducting state. Since the output node O is at the L level, the P-type transistor (first current interrupting circuit) 15 is in the conducting state. Since the inverted output node O is at the H level, the P-type transistor (second current interrupting circuit) 16 is in the non-conducting state. When the input signal IN changes to the H level in the circumstances, since both of the P-type transistor (first current interrupting circuit) 15 and the first P-type transistor 3 are in the conducting state, as the first N-type signal input transistor 1 shifts to the conducting state, the first current mirror circuit 10 operates to amplify the current flowing in the first N-type transistor 1 by the predetermined number α×β of times. Therefore, the same operation as that of the level shift circuit shown in FIG. 1 is assured. In the circumstances, the inverted input signal XIN changes from the H level to the L level. Since the second P-type transistor 4 and the P-type transistor (second current interrupting circuit) 16 are in the non-conducting state, the second current mirror circuit 11 does not operate.

After completion of a change to the H level of the input signal IN and a change to the L level of the inversion input signal, the change to the H level of the output node O is finished, and the P-type transistor (first current interrupting circuit) 15 is made non-conducting. Consequently, the current path from the high voltage source VDD to the P-type current mirror circuit 10P of the first current mirror circuit 10 is interrupted, and the current fed from the P-type current mirror 10P is interrupted. Similarly, on completion of the change to the H level of the output node O, the first P-type transistor 3 is made non-conducting, so that the current path from the high voltage source VDD to the N-type current mirror circuit 10N of the first current mirror circuit 10 is interrupted, and the current fed from the N-type current mirror circuit 10N is interrupted. Therefore, in the embodiment, when the input signal IN enters the steady state of the H level, the P-type current mirror circuit 10P in the first current mirror circuit 10 can be reliably prevented from passing steady current uselessly. Thus, power consumption can be reduced.

Figure 5:
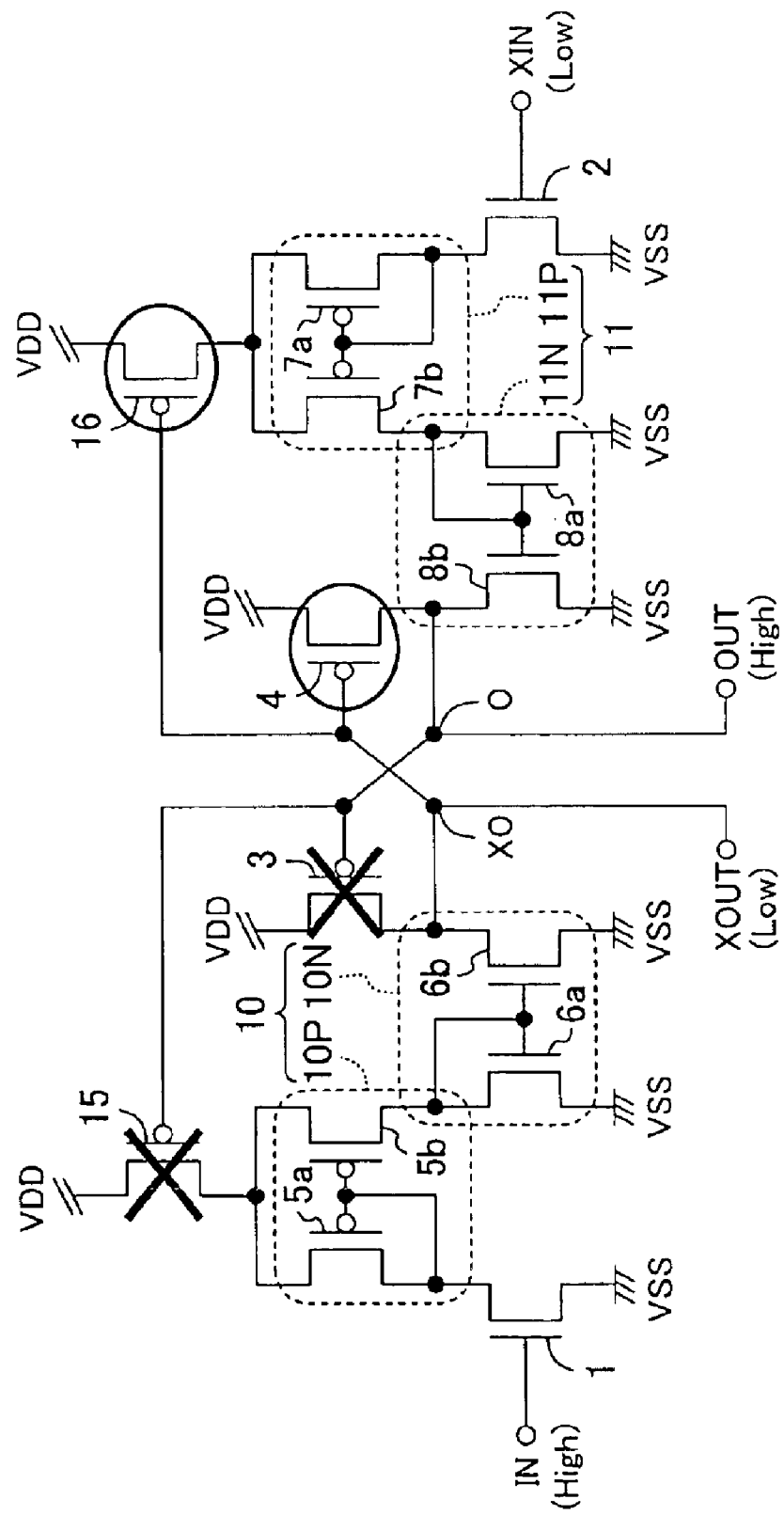
FIG. 5 is a diagram showing operation performed when a change to the H level of an input signal and a change to the L level of an inverted input signal are finished in the level shift circuit.

In the case where the input signal IN enters the stationary state of the H level, the inverted input signal XIN enters the stationary state of the L level, and the inverted output node XO enters the stationary state of the L level. At this time, as shown in FIG. 5, the second P-type transistor 4 and the P-type transistor (second current interrupting circuit) 16 enter the conducting state and it is prepared to enable the amplifying operation of the second current mirror circuit 11 to be performed when the inverted input signal XIN changes to the H level next.

Although the case where the input signal IN enters the stationary state of the H level has been described above, the operation performed in the case where the inverted input signal XIN enters the stationary state of the H level is similar to the above.

Obviously, either the output signal O or the inverted output signal XO may be output to the outside also in the embodiment.

Embodiment 3

Figure 8:
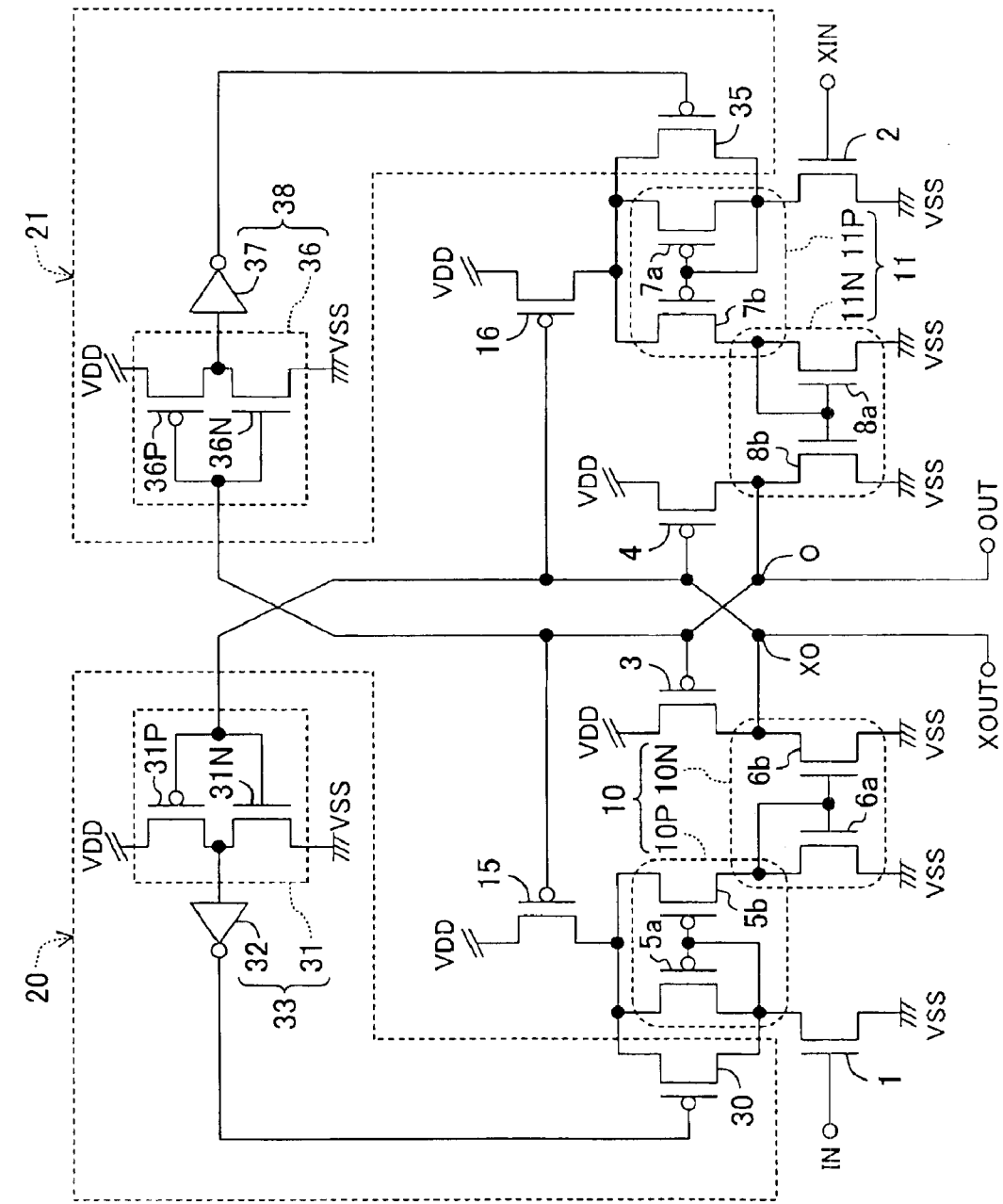
FIG. 8 is a diagram showing the configuration of a level shift circuit of a third embodiment of the invention.

FIG. 8 shows a level shift circuit of a third embodiment of the invention.

The level shift circuit of FIG. 8 is obtained by further improving the level shift circuit of the second embodiment shown in FIG. 3. Specifically, the level shift circuit of FIG. 8 is obtained by adding first and second change speed accelerating circuits 20 and 21 to the level shift circuit of FIG. 3. The first and second change speed accelerating circuits 20 and 21 are to accelerate change speed from the L level to the H level of the inverted output node XO and the output node O as will be described later.

The first change speed accelerating circuit 20 includes a first P-type transistor 30 connected in parallel with the P-type transistor 5a on the input side as a component of the P-type current mirror circuit 10P of the first current mirror circuit 10, and a first buffer circuit 33 constructed by two inverter circuits 31 and 32. The first P-type transistor 30 is set to have a large gate width and extremely high current driving capability relative to the parallel-connected input side P-type transistor 5a of the P-type current mirror circuit 10P. In the first buffer circuit 33, the inverter circuit 31 has a P-type transistor 31P and an N-type transistor 31N which are connected in series between the high voltage source VDD and the ground. The inverted output node XO is connected to both of the gate electrodes of the transistors 31P and 31N, the other inverter circuit 32 is connected to the output side (the connection point between the drain electrode of the P-type transistor 31P and the drain electrode of the N-type transistor 31N), and the output side of the inverter circuit 32 is connected to the gate electrode of the P-type transistor 30.

Similarly, the second change speed accelerating circuit 21 has a second P-type transistor 35 connected in parallel with the P-type transistor 7a on the input side as a component of the P-type current mirror circuit 11P of the second current mirror circuit 11, and a second buffer circuit 38 constructed by two inverter circuits 36 and 37. Since the connecting relation among the devices is similar to that in the first change speed accelerating circuit 20, the description will not be repeated.

The operation of the embodiment will now be described. First, a tendency that a change from the L level to the H level lags behind a change from the H level to the L level in the output node O and the inverted output node XO in the configuration of FIG. 3 showing the second embodiment will be described.

Figure 6:
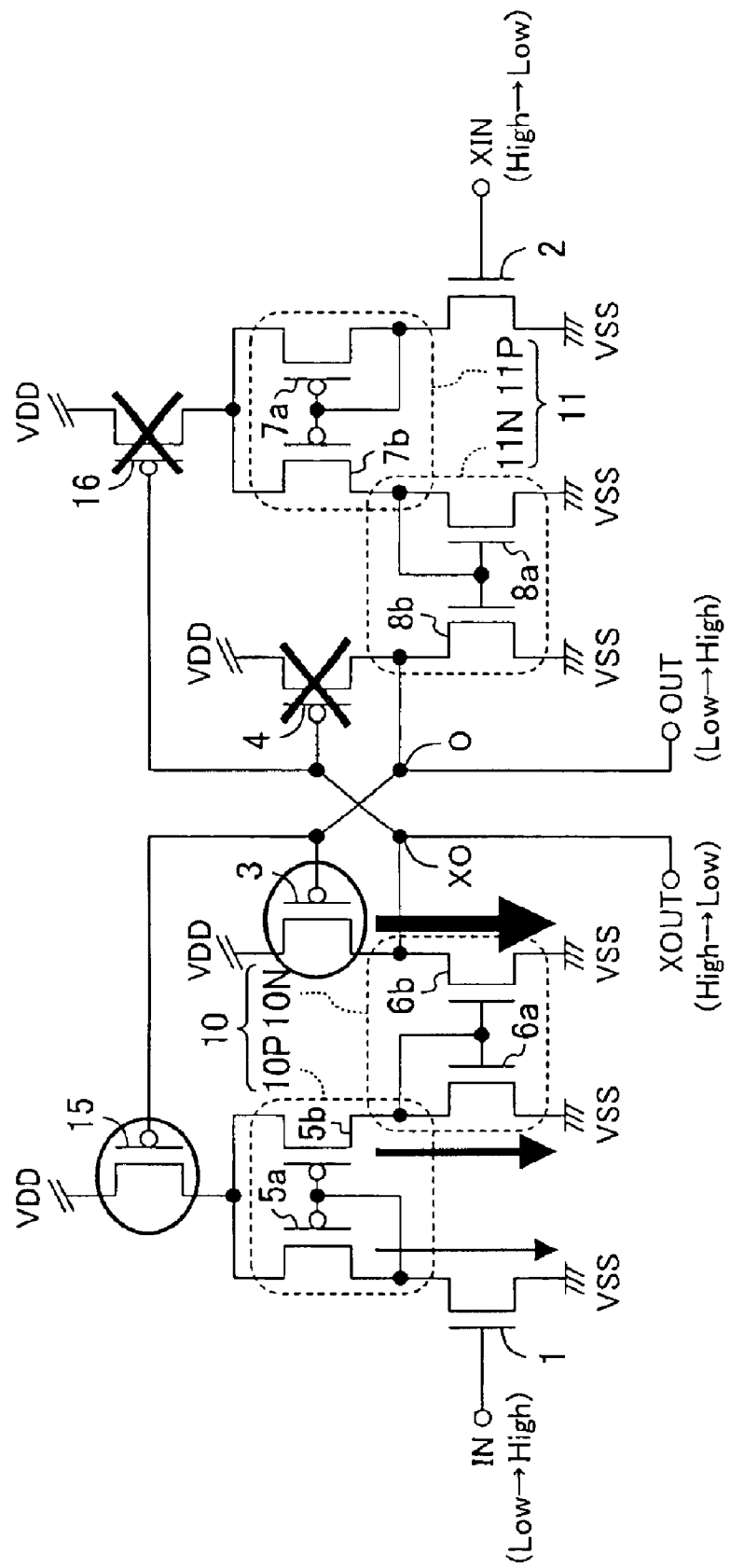
FIG. 6 is a diagram showing operation performed at transient time in which the input signal changes to the H level and the inverted input signal changes to the L level in the level shift circuit.

The tendency will be described with reference to FIG. 6. FIG. 6 shows that, when the input signal IN changes from the L level to the H level and the inverted input signal XIN changes from the H level to the L level, the change to the H level of the output node O lags behind the change to the L level of the inverted output node XO.

Figure 7:
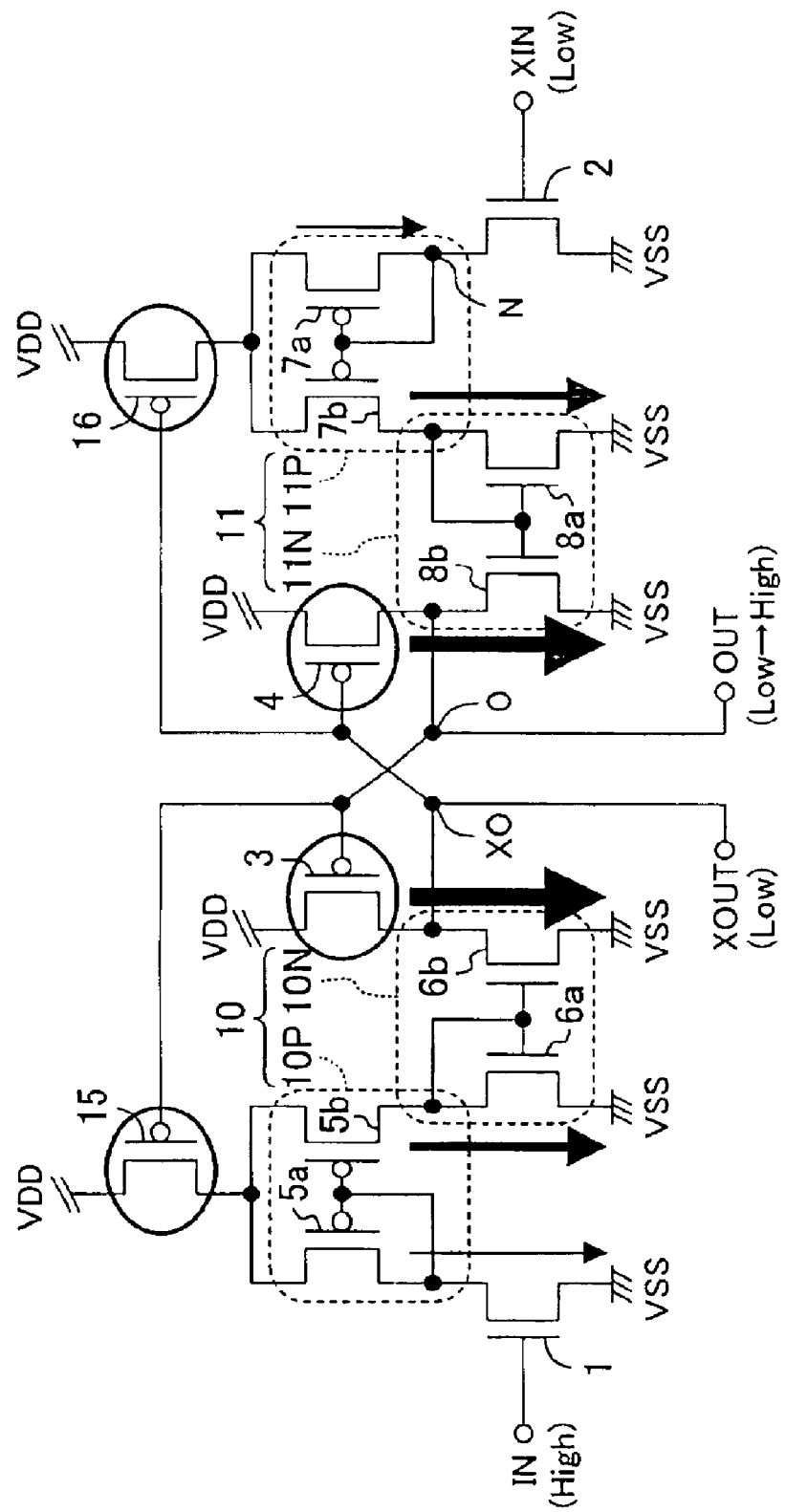
FIG. 7 is a diagram illustrating that a change from the L level to the H level of an output node tends to delay in the level shift circuit.

In FIG. 6, with a change to the H level of the input signal IN, the inverted output node XO changes promptly from the H level to the L level by the current amplification action of the first current mirror circuit 10 as described above. Consequently, the second P-type transistor 4 and the P-type transistor (second current interrupting circuit) 16 shift from the non-conducting state shown in FIG. 6 to the conducting state shown in FIG. 7. As a result, the current path from the high voltage source VDD to the P-type current mirror circuit 11P of the second current mirror circuit 11 is constructed via the P-type transistor (second current interrupting circuit) 21. At this time, the inverted input signal XIN is at the L level and the second N-type transistor 2 is in the non-conducting state, so that current starts flowing so as to charge parasitic capacitance of the node N (the drain electrode of the P-type transistor 7a and the gate electrodes of the P-type transistors 7a and 7b) from the high voltage source VDD via the input-side P-type transistor 7a as a component of the P-type current mirror circuit 11P of the second current mirror circuit 11. Until the potential of the node N rises to the potential by which the P-type transistors 7a and 7b are made non-conducting, the current keeps on flowing. The P-type transistor 7a on the input side of the P-type current mirror circuit 11P has a gate width smaller than that of the output-side P-type transistor 7b as understood also from the equation from the viewpoint of the function of the current mirror circuit and the current driving capability of the P-type transistor 7a is low, so that the flowing period of the current is long. In the period in which the current flows, the second current mirror circuit 11 passes amplified current from the output-side N-type transistor 8b in the N-type current mirror circuit 11N. In association with the change to the L level of the inverted output node XO, the second P-type transistor 4 is made conducting, current is supplied from the high voltage source VDD, and the output node O changes from the L level to the H level. However, due to the amplified current from the N-type transistor 8b to the ground, the change to the H level tends to delay.

In the embodiment, such a tendency can be eliminated by the first and second change speed accelerating circuits 20 and 21 as will be described hereinbelow.

Figure 9:
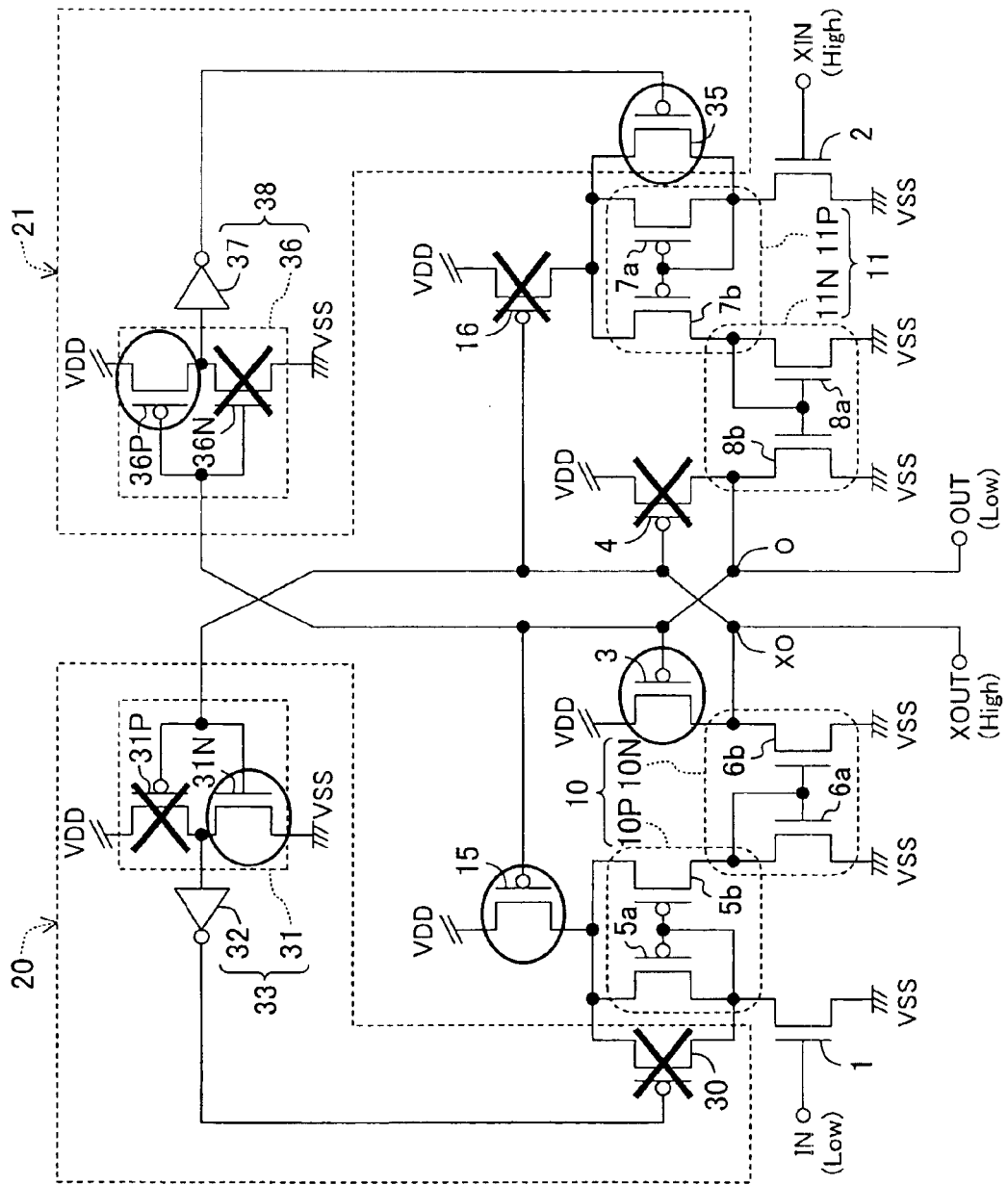
FIG. 9 is a diagram showing operation performed in the case where the input signal is at the L level and the inverted input signal is at the H level in the level shift circuit.

In a manner similar to the above, the case where the input signal IN changes from the L level to the H level and the inverted input signal XIN changes from the H level to the L level will be described. First, as shown in FIG. 9, when the input signal IN is at the L level and the inverted input signal XIN is at the H level, the output node O is at the L level, and the inverted output node XO is at the H level. Consequently, in the second change speed accelerating circuit 21, a P-type transistor 36P of the inverter circuit 36 enters the conducting state, the N-type transistor 36N enters the non-conducting state, the gate potential of the P-type transistor 35 becomes the L level, and the P-type transistor 35 enters the conducting state.

Figure 10:
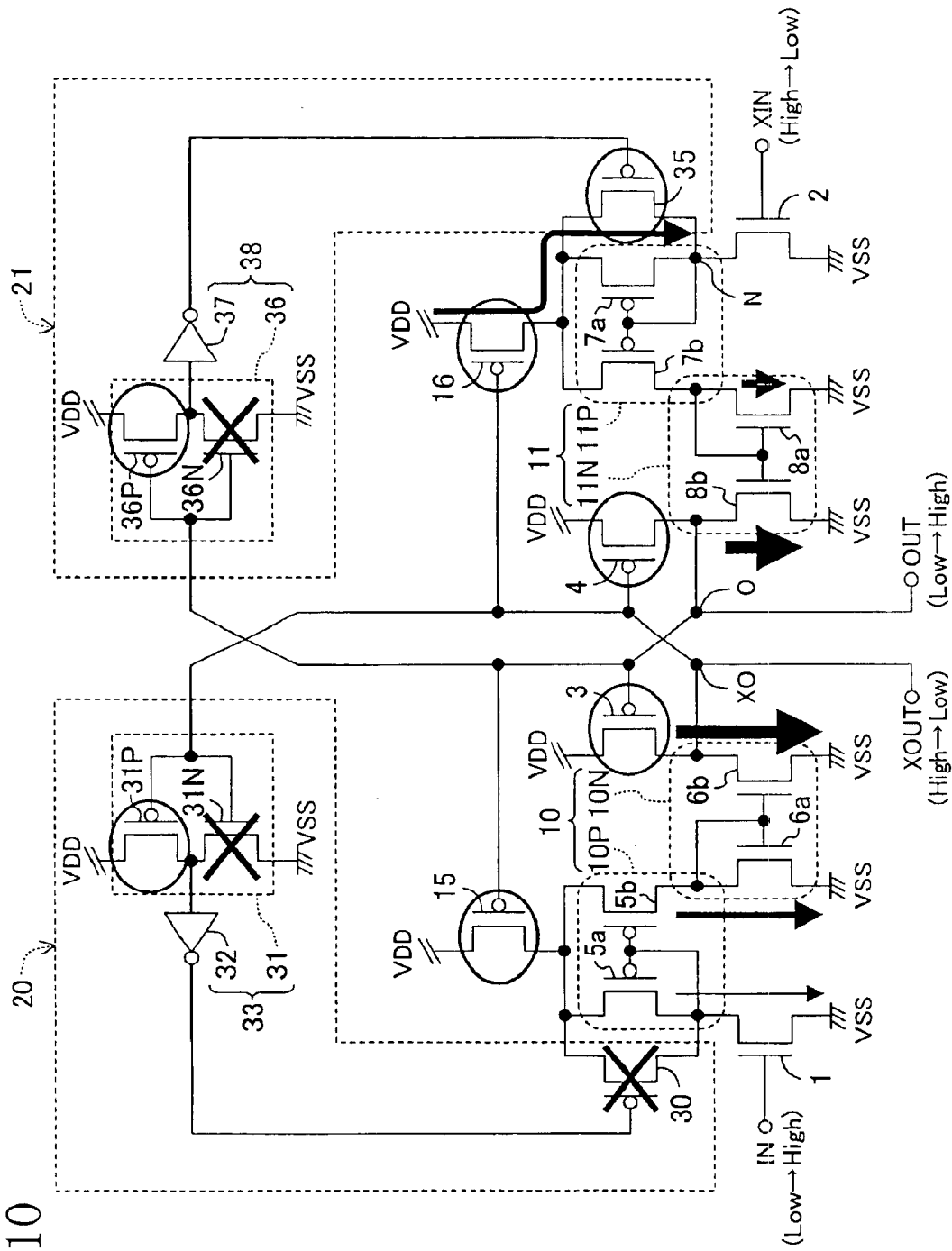
FIG. 10 is a diagram showing operation performed at transient time in which the input signal changes from the L level to the H level and the inverted input signal changes from the H level to the L level in the level shift circuit.

After that, as shown in FIG. 10, when the input signal IN changes to the H level and the inverted input signal XIN changes to the L level, the inverted output node XO changes to the L level by the amplification action of the first current mirror circuit 10 as described above, and the second P-type transistor 4 and the P-type transistor (second current interrupting circuit) 16 are made conducting. Therefore, a large current flows from the high voltage source VDD to the node N via the P-type transistor (second current interrupting circuit) 16 and, further, the second P-type transistor 35 of high capability of the second change speed accelerating circuit 21 to charge the parasitic capacitance of the node N at high speed. As a result, the period until the two P-type transistors 7a and 7b of the P-type current mirror circuit 11P enter the non-conducting state is shortened. Accordingly, the supply time of the amplified current passed from the output-side N-type transistor 8b of the N-type current mirror circuit 11N is also shortened, time of the change from the L level to the H level of the output node O is also shortened, and the change speed to the H level of the output node O is accelerated.

Figure 11:
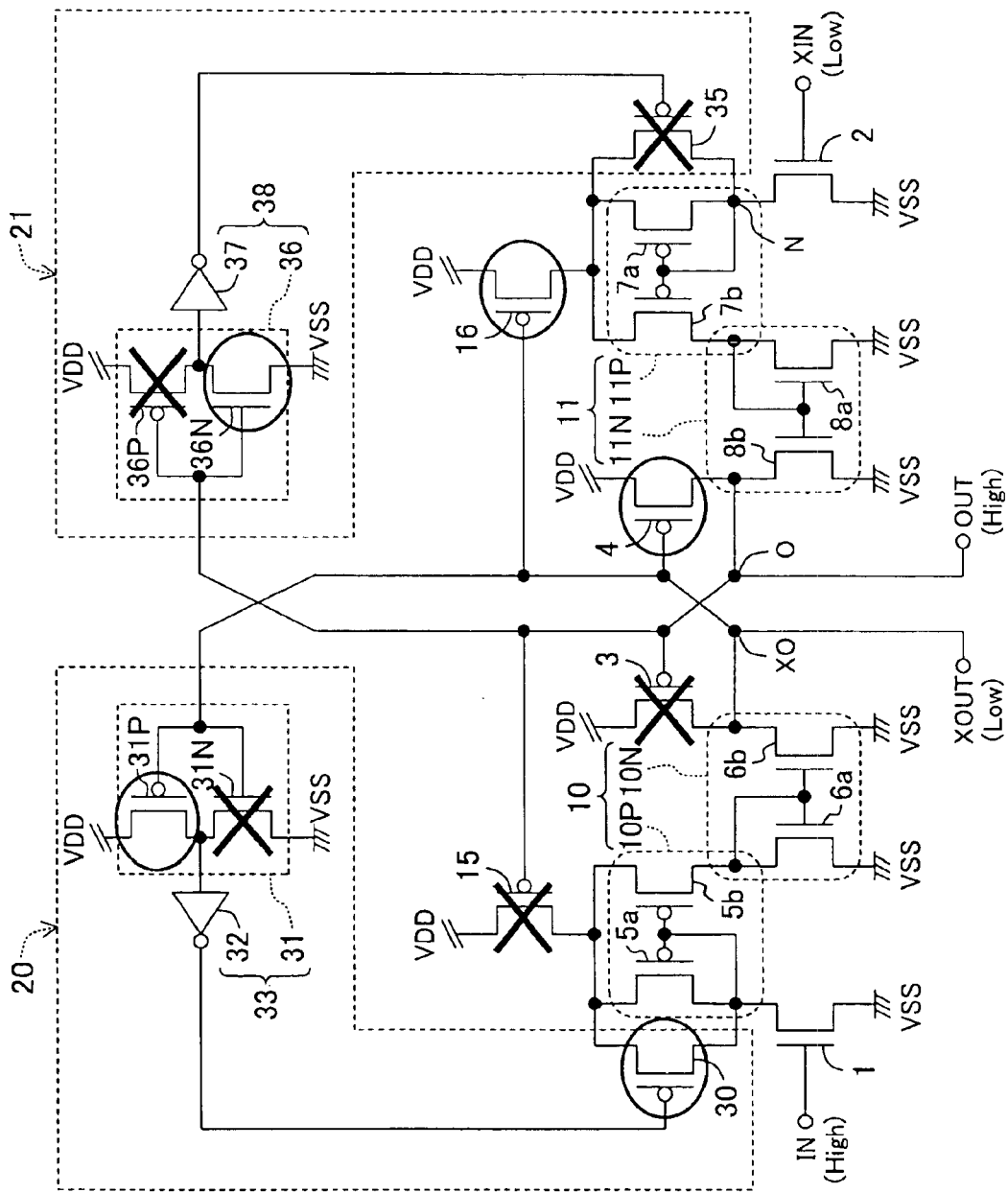
FIG. 11 is a diagram showing operation performed when a change to the H level of the input signal and a change to the L level of the inverted input signal are finished in the level shift circuit.

When the output node O changes to the H level, as shown in FIG. 11, in the second change speed accelerating circuit 21, the P-type transistor 36P of the inverter circuit 36 enters a non-conducting state, the N-type transistor 36N enters a conducting state, the potential of the gate electrode of the second P-type transistor 35 becomes the H level, and the second P-type transistor 35 enters a non-conducting state. In such a manner, it is prepared for a next change to the H level of the inverted input signal XIN.

Although the time when the output node O changes to the H level has been described above, the operation is similarly performed also when the inverted output node XO changes to the H level.

Therefore, in the embodiment, the change time from the L level to the H level of the output node O and the inverted output node XO can be effectively shortened.

Obviously, also in the embodiment, either the output signal O of the output node O or the inverted output signal XO of the inverted output node XO may be output to the outside.

Although the first and second change speed accelerating circuits 20 and 21 are constructed by the first and second buffer circuits 33 and 38 in the embodiment, the invention is not always limited to the configuration but may employ the other configurations.

Embodiment 4

Figure 12:
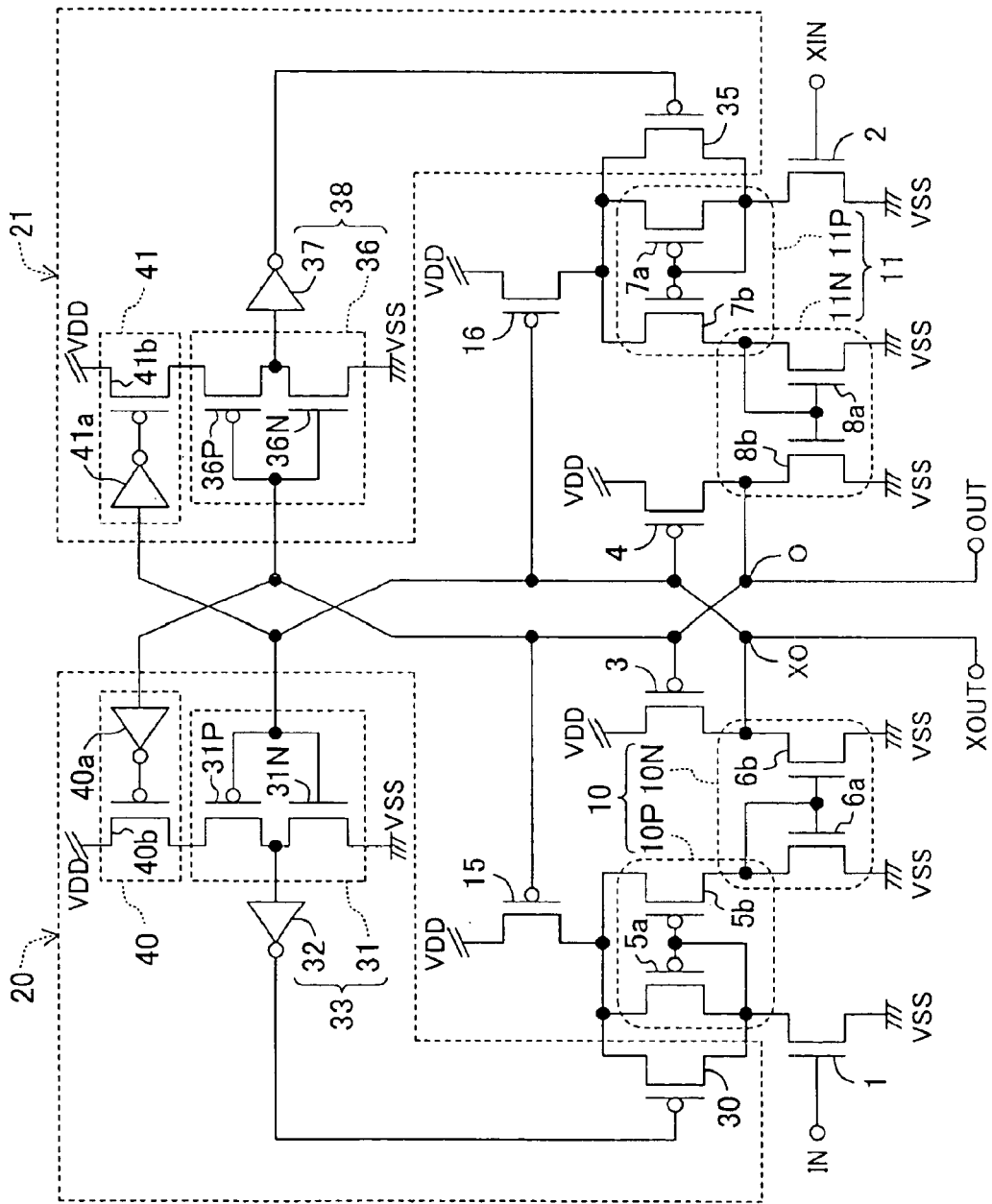
FIG. 12 is a diagram showing the configuration of a level shift circuit of a fourth embodiment of the invention.

FIG. 12 shows a level shift circuit of a fourth embodiment of the invention.

The level shift circuit of FIG. 12 is obtained by improving the level shift circuit of the third embodiment. Concretely, the first and second change speed accelerating circuits 20 and 21 of the level shift circuit shown in FIG. 8 are improved.

To be specific, in the level shift circuit of FIG. 12, a first control circuit 40 is added in the first change speed accelerating circuit 20. The first control circuit 40 has an inverter 40a connected to the output node O and a P-type transistor 40b having a gate electrode for receiving an output of the inverter 40a. The source electrode of the P-type transistor 40b is connected to the high voltage source VDD, and the drain electrode is connected to the source electrode of the P-type transistor 31P of the inverter circuit 31 as a component of the first buffer circuit 33. Therefore, in the first control circuit 40, after the signal of the output node O, that is, the output signal O changes from the L level to the H level, the P-type transistor 40a enters a conducting state, the high voltage power source VDD is connected to the first buffer circuit 33, and the operation of the buffer circuit 33 is permitted.

On the other hand, in the second change speed accelerating circuit 21, a second control circuit 41 is added. The second control circuit 41 has an inverter 41a connected to the inverted output node XO and a P-type transistor 41b having a gate electrode for receiving an output of the inverter 41a. The source electrode of the P-type transistor 41b is connected to the high voltage source VDD, and the drain electrode is connected to the source electrode of the P-type transistor 36P of the inverter circuit 36 as a component of the second buffer circuit 38. Therefore, in the second control circuit 41, after the inverted output signal XO changes from the L level to the H level, the P-type transistor 41a enters a conducting state, the high voltage power source VDD is connected to the second buffer circuit 38, and the operation of the buffer circuit 38 is permitted.

The fourth embodiment produces the following effect in comparison with the third embodiment. In the third embodiment, as shown in FIG. 10, by a change from the H level to the L level of the inverted output node XO, the P-type transistor 16 is made conducting, and a large current is supplied to the parasitic capacitance of the node N from the high voltage source VDD via the large-capacity P-type transistor 35 in the second change speed accelerating circuit 21. At that time, the change from the H level to the L level of the inverted output node XO is propagated to the gate electrode of the first P-type transistor 30 via the first buffer circuit 33 of the first change speed accelerating circuit 20 after predetermined delay time, and the first P-type transistor 30 is made conducting. In this case, if delay time of the first buffer circuit 33 is short, before the potential of the inverted output node XO is determined as the L level, the first P-type transistor 30 of the first change speed accelerating circuit 20 is made conducting and large current from the high voltage source VDD charges the drain electrode of the first N-type transistor 1 via the first P-type transistor 30. Accordingly, longer time for determining the L level from the H level of the inverted output node XO is necessary and delay occurs in determination of the L level. This problem can be solved by setting long delay time of the first buffer circuit 33. However, if the delay time is set to be too long, the cycle of the input signal IN is regulated by the delay time, and it becomes necessary to set the cycle of the input signal IN to be long.

In contrast, in the fourth embodiment, only after the potential of the output node O changes to the H level, the first control circuit 40 permits the operation of the first buffer circuit 33 in the first change speed accelerating circuit 20. Therefore, conduction of the first P-type transistor 30 in the first change speed accelerating circuit 20 can be controlled by both the change to the H level of the output node O and the change to the L level of the inverted output node XO, and occurrence of a delay in determination of the L level of the inverted output node XO can be effectively controlled. In a manner similar to the above, delay in determination of the L level of the output node O can be also suppressed.

Obviously, also in the fourth embodiment, either the output signal O of the output node O or the inverted output signal XO of the inverted output node XO may be output to the outside.

Embodiment 5

A fifth embodiment of the invention will now be described.

Figure 13:
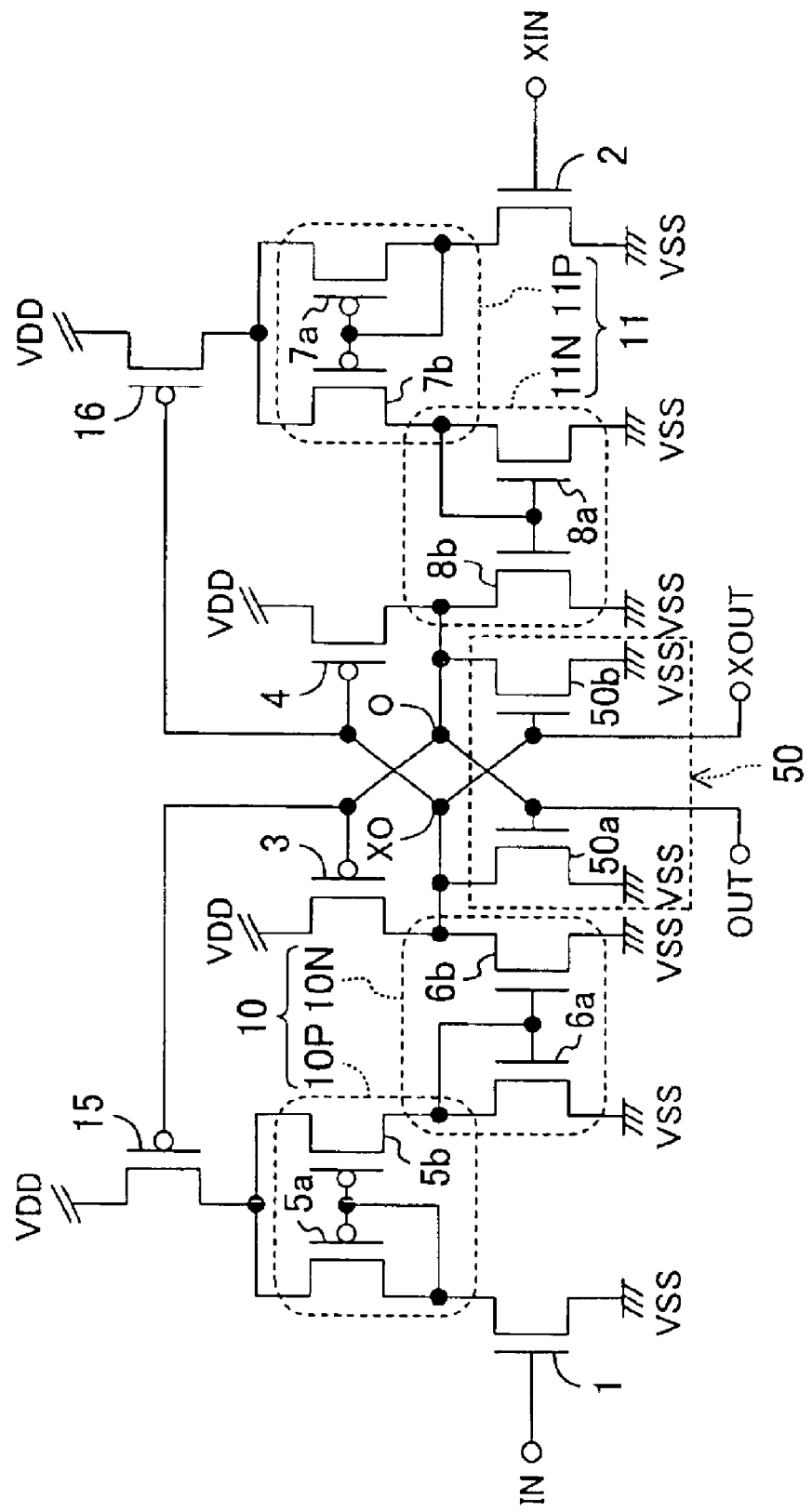
FIG. 13 is a diagram showing the configuration of a level shift circuit of a fifth embodiment of the invention.

FIG. 13 shows a level shift circuit of the fifth embodiment. The level shift circuit of the diagram is obtained by adding a stabilizing circuit 50 to the level shift circuit of FIG. 3.

The stabilizing circuit 50 has first and second N-type transistors 50a and 50b. In the first N-type transistor 50a, a gate electrode is connected to the output node O, a drain electrode is connected to the inverted output node XO, and a source electrode is connected to the ground. On the other hand, in the second N-type transistor 50b, a gate electrode is connected to the inverted output node XO, a drain electrode is connected to the output node O, and a source electrode is connected to the ground.

In the level shift circuit shown in FIG. 3, in the case where the potentials of both of the input signal IN and the inverted input signal XIN are indeterminate in the initial state where the high voltage source VDD starts to be supplied to the level shift circuit, all of the first and second N-type transistors 1 and 2 and the two P-type transistors 3 and 4 tend to enter a conducting state. A feed-through current flows from the high voltage source VDD to the ground via the N-type transistors 6b and 8b of the N-type current mirror circuits 10N and 11N, and the potentials at the output node O and the inverted output node XO become indeterminate. The feed-through current transiently continues until the input signal IN and the inverted input signal XIN are determined at a predetermined L or H level.

In the embodiment, however, for example, when the potential of the inverted output node XO is higher than that of the output node O, tendency that the second N-type transistor 50b of the stabilizing circuit 50 becomes conductive is increased and tendency that the second P-type transistor 4 becomes non-conducting is also increased, thereby further decreasing the potential of the output node O. As the potential of the output node O decreases, tendency that the first N-type transistor 50a in the stabilizing circuit 50 becomes non-conducting is increased and tendency that the first P-type transistor 3 becomes conducting is increased, thereby further increasing the potential of the inverted output node XO. By such a positive feedback, the output node O is determined at the L level and the inverted output node XO is determined at the H level early.

Therefore, in the embodiment, even if the input signal IN and the inverted input signal XIN are indeterminate in the initial state, the potentials of the output node O and the inverted output node XO can be determined at the L or H level early, and a transient feed-through current passed until the determination can be effectively reduced.

Modifications

Figure 14:
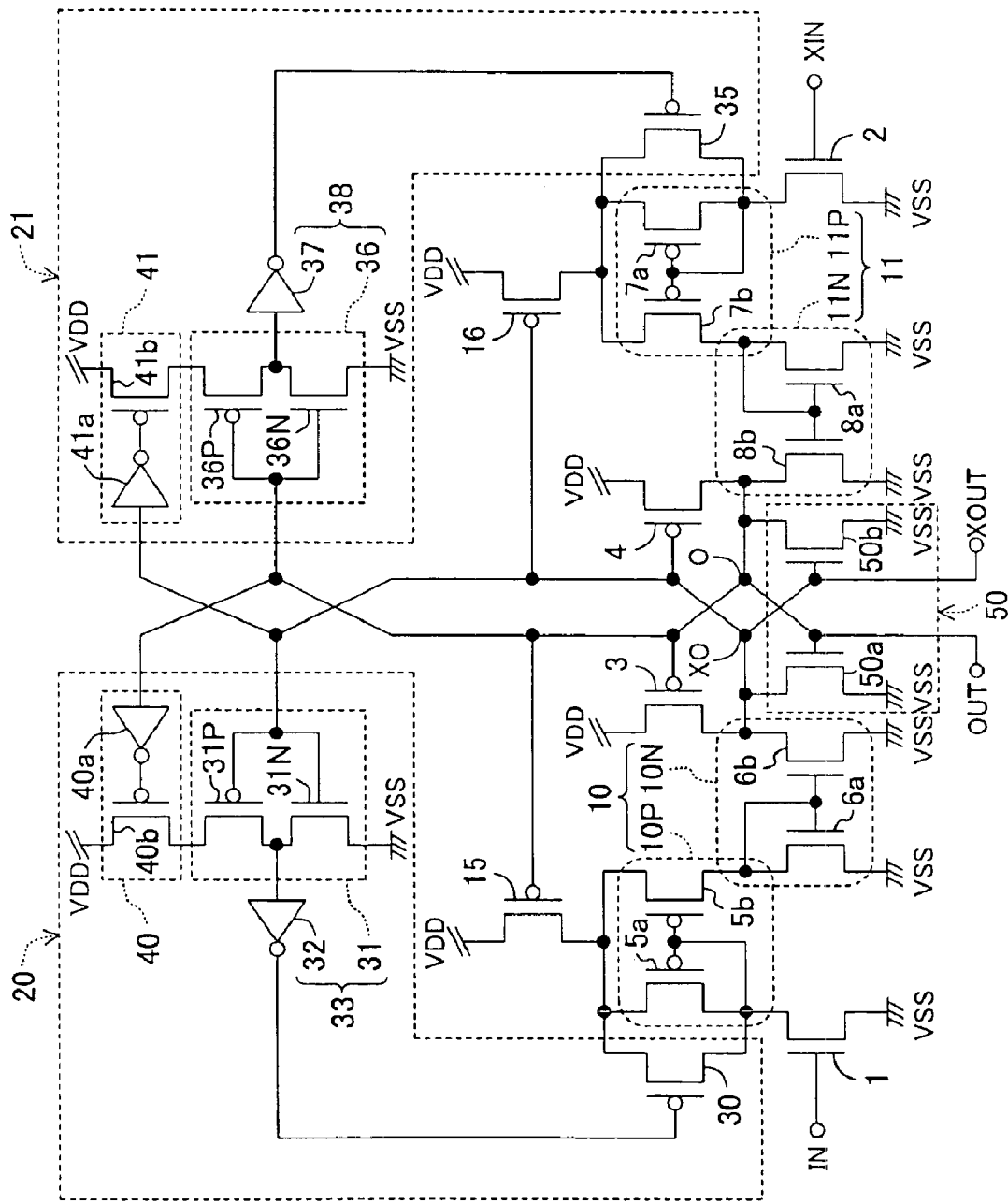
FIG. 14 is a diagram showing the configuration of a level shift circuit as a modification of the fifth embodiment of the invention.

FIG. 14 shows a modification of the level shift circuit of the fifth embodiment.

In the fifth embodiment, the stabilizing circuit 50 is added to the level shift circuit of FIG. 3. In a modification, the stabilizing circuit 50 is added to the level shift circuit of the fourth embodiment shown in FIG. 12. Since the other configuration is similar to that of FIG. 13, the description will not be repeated.

Although the level shift circuit having the P-type transistors 3 and 4 has been described in each of the first to fifth embodiments, the invention is not limited to the configuration but can be applied to level shift circuits of various configurations. It is sufficient for the level shift circuit to have the first and second N-type transistors 1 and 2 for signal input.

Embodiment 6

Figure 15:
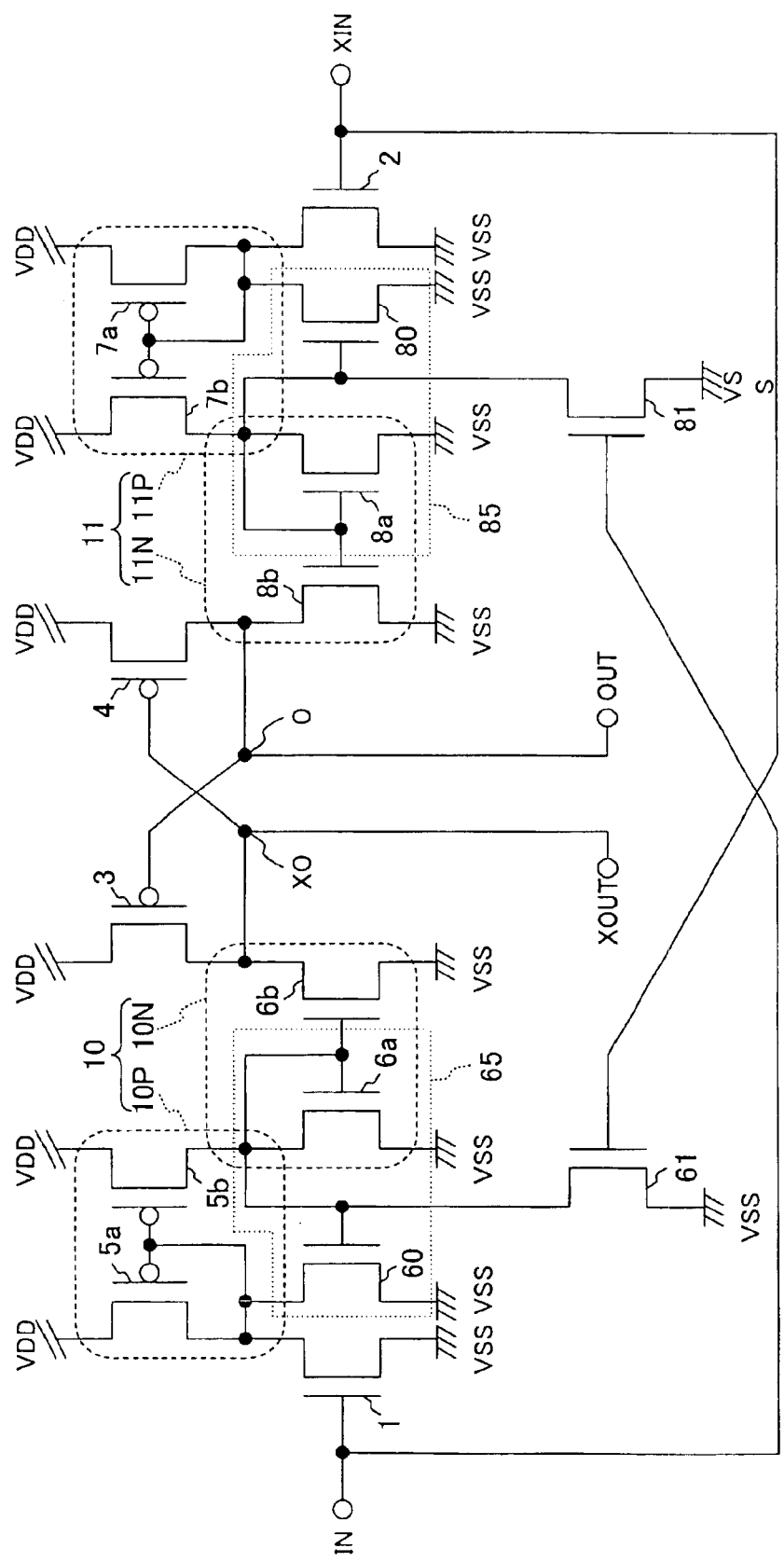
FIG. 15 is a diagram showing the configuration of a level shift circuit of a sixth embodiment of the invention.

FIG. 15 shows a level shift circuit of a sixth embodiment of the invention.

A level shift circuit of the sixth embodiment is obtained by adding the following components to the level shift circuit shown in FIG. 1.

Specifically, in the level shift circuit shown in FIG. 15, a first N-type current feedback transistor 60 is connected in parallel with the first N-type signal input transistor 1. The first N-type current feedback transistor 60 is controlled by the potential of the connection point between the P-type current mirror circuit 10P of the first current mirror circuit 10 and the N-type current mirror circuit 10N of the first current mirror circuit 10. Similarly, a second N-type current feedback transistor 80 is connected in parallel with the second N-type signal input transistor 2. The second N-type current feedback transistor 80 is controlled by the potential of the connection point between the P-type current mirror circuit 11P of the second current mirror circuit 11 and the N-type current mirror circuit 11N of the second current mirror circuit 11.

Further, the first N-type current feedback transistor 60 constructs a third current mirror circuit 65 in cooperation with the N-type transistor 6a of the N-type current mirror circuit 10N of the first current mirror circuit 10, and has the function of repeatedly amplifying current by feeding back current amplified by the P-type current mirror circuit 10P of the first current mirror circuit 10 to the P-type current mirror circuit 10P of the first current mirror circuit 10. Similarly, the second N-type current feedback transistor 80 constructs a fourth current mirror circuit 85 in cooperation with the N-type transistor 8a in the N-type current mirror circuit 1N of the second current mirror circuit 11 and has the function of repeatedly amplifying current by feed ing back current amplified by the P-type current mirror circuit 11P of the second current mirror circuit 11 to the P-type current mirror circuit 11P of the second current mirror circuit 11.

Further, in the embodiment, a third N-type transistor 61 and a fourth N-type transistor 81 are disposed. In the third N-type transistor 61, a gate electrode is connected to the inverted input terminal XIN, a source electrode is connected to the ground, and a drain electrode is connected to the gate electrode of the first N-type current feedback transistor 60, in other words, the connection point between the P-type current mirror circuit 10P and the N-type current mirror circuit 10N in the first current mirror circuit 10. In the fourth N-type transistor 81, a gate electrode is connected to the input terminal IN, a source electrode is connected to the ground, and a drain electrode is connected to the gate electrode of the second N-type current feedback transistor 80, in other words, to the connection point between the P-type current mirror circuit 11P and the N-type current mirror circuit 11N in the second current mirror circuit 11.

When leak current of the first and second current mirror circuits 10 and 11 is large, the third and fourth N-type transistors 61 and 81 suppress erroneous operation which is caused by the leak current. For example, the embodiment will be described by using an example where the input signal IN is 0V and the inverted input signal XIN is 1.5V. In this state, inherently, no current flows in the first current mirror circuit 10. However, in the case where the leak current of the P-type transistor 5b in the P-type current mirror circuit 10P is large, if the third N-type transistor 61 does not exist, the leak current is amplified by the third current mirror circuit 65 constructed by the N-type transistor 6a in the N-type current mirror circuit 10N and the first N-type current feedback transistor 60, so that current flows in the first current mirror circuit 10 and the operation is not performed correctly. However, the third N-type transistor 61 leads the leak current to the ground, so that erroneous operation is not performed.

The operation of the level shift circuit of the embodiment will now be described. The operation will be described on assumption that the amplification level of the input signal IN and the inverted input signal XIN is 0.7V, the power source potential of the high voltage power source VDD is 3V, the potential of the ground power source VSS is 0V, and the amplification level of the output signal O and the inverted output signal XO is 3V.

First, as the initial state, it is assumed that the input signal IN is 0V, the inverted input signal XIN is 0.7V, the output signal O is 0V, and the inverted output signal XO is 3V. At this time, the first N-type signal input transistor 1, the fourth N-type transistor 81, and the second P-type transistor 4 are in a non-conducting state. On the other hand, the second N-type signal input transistor 2, the third N-type transistor 61, and the first P-type transistor 3 are in a conducting state. Even if leak current occurs in the P-type transistor 5b in the P-type current mirror circuit 10P, the third N-type transistor 61 is in the conducting state, so that the leak current flows via the third N-type transistor 61 and no erroneous operation occurs.

A case where the input signal IN changes to 0.7V and the inverted input signal XIN changes to 0V will now be considered. By the potential change, the first N-type signal input transistor 1 and the fourth N-type transistor 81 enter the conducting state, and the second N-type signal input transistor 2 and the third N-type transistor 61 enter the non-conducting state. At this time, current flows in the first N-type signal input transistor 1 and is amplified by the predetermined number $\alpha(=(W2/L2)/(W1/L1))$ of times by the P-type current mirror circuit 10P in the first current mirror circuit 10. Since the P-type transistor 3 is conducting, the amplified current is further amplified by the predetermined number $\beta(=(W2/L2)/(W1/L1))$ of times by the N-type current mirror circuit 10N. The current amplified by the predetermined total number $\alpha \times \beta$ of times is connected from the inverted output node XO to the ground via the other N-type transistor 6b of the N-type current mirror circuit 10N. Further, the first N-type current feedback transistor 60 and the N-type transistor 6a in the N-type current mirror circuit 10N construct the third current mirror circuit 65. If the current mirror circuit 65 also amplifies the current by the predetermined number $\beta(=(W2/L2)/(W1/L1))$ of times, the amplified current is amplified again by the first current mirror circuit 10. Consequently, the current drawn out from the output node XO becomes extremely large in short time. Therefore, when the voltage of the input signal IN is as low as 0.7V, the current driving capability of the first N-type signal input transistor 1 drops, current flowing in the transistor 1 is small but the drive current for the inverted output node XO is made large, thereby enabling the potential to be changed quickly from the H level to the L level of the inverted output node XO.

By the large drive current from the inverted output node XO, the potential of the inverted output node XO decreases to the intermediate value determined by the ratio between the conduction resistance value of the N-type transistor 6b in the N-type current mirror circuit 10N and the conduction resistance value of the first P-type transistor 3. When the time until the intermediate value exceeds the threshold voltage of the second P-type transistor 4 is shortened, the second P-type transistor 4 enters the conducting state early at this time point. Thus, the potential of the output node O also rises quickly. By the potential rise of the output node O, the first P-type transistor 3 quickly shifts to the non-conducting state, so that the conduction resistance value of the first P-type transistor 3 increases quickly and the potential of the inverted output node XO decreases more quickly. By such a positive feedback, the potential of the inverted output node XO changes to 0V, the potential of the output node O changes to 3V, and operation of shifting the input signals IN and XIN of the low amplification level (0.7V) to the output signal O and the inverted output signal XO of the high amplification level (3V) is completed.

Although the example of the operation performed at the time of a change of rise in the input signal IN has been described above, the operation at the time of a change of rise in the inverted input signal XIN is similar to the above. The description will not be repeated here.

Therefore, in the level shift circuit of the embodiment, even if the voltage of the input signal IN and the inverted input signal XIN decreases, due to the increased current driving capability of the output node O and the inverted output node XO by using the current mirror circuits 10 and 11 and the N-type transistors 60 and 80 for current feedback, a change speed of the output signal O and the inverted output signal XO can be increased and the high-speed operation can be assured.

In the embodiment, the output terminal OUT and the inverted output terminal XOUT are connected to the output node O and the inverted output node XO and both of the output signal O and the inverted output signal XO are output to the outside. However, the invention is not limited to the configuration. Obviously, the configuration of outputting only the output signal O or the inverted output signal XO to the outside may be also employed.

Although each of the first and second current mirror circuits 10 and 11 is constructed by a pair of one P-type current mirror circuit and one N-type current mirror circuit in the embodiment, obviously, each of the first and second current mirror circuits 10 and 11 may be also constructed by plural pairs.

Embodiment 7

Figure 17:
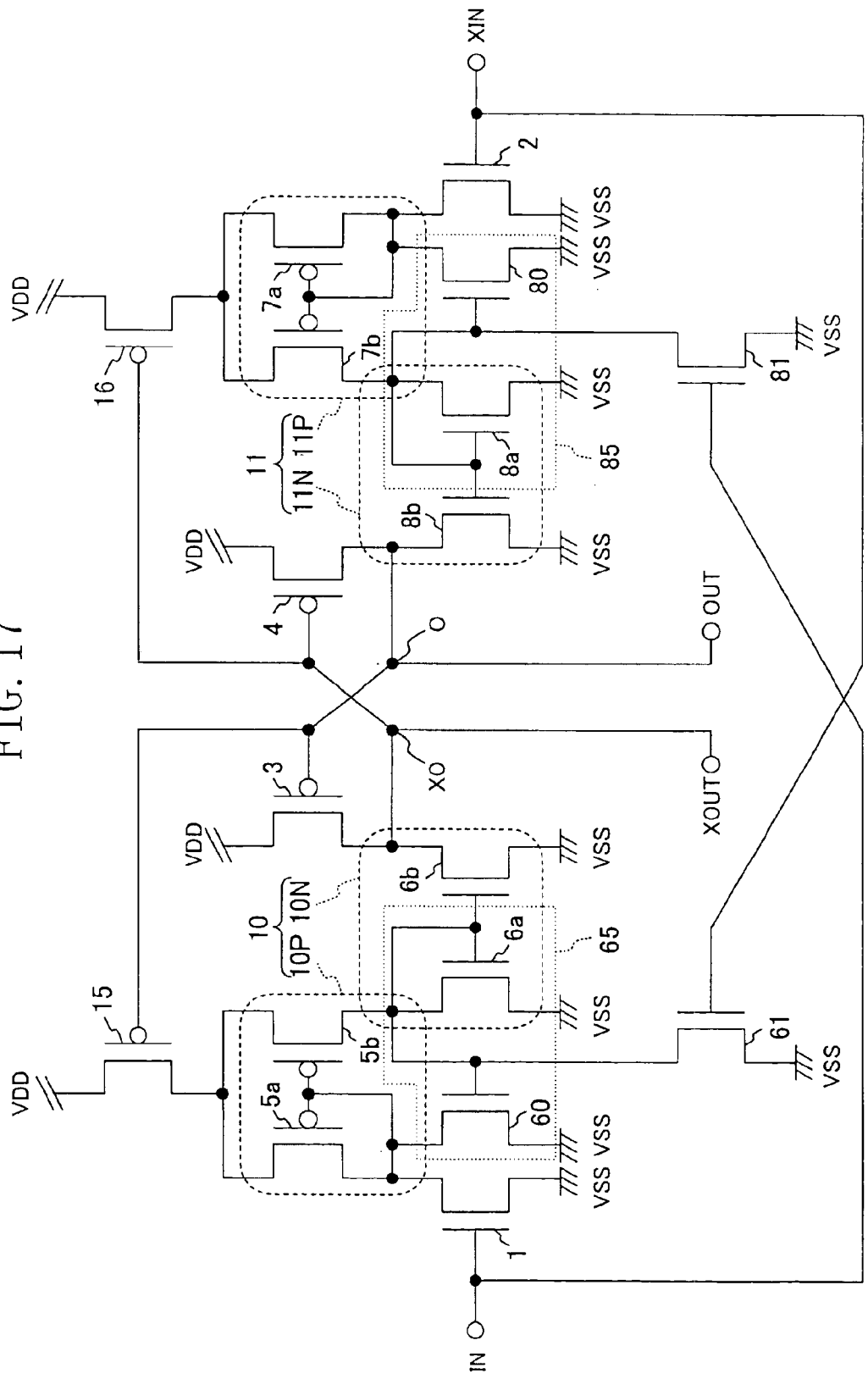
FIG. 17 is a diagram showing the configuration of a level shift circuit of a seventh embodiment of the invention.

FIG. 17 shows a level shift circuit of a seventh embodiment of the invention.

The level shift circuit of the diagram is obtained by improving the level shift circuit of the sixth embodiment by reducing the current steadily flowing in the first and second current mirror circuits 10 and 11.

The level shift circuit of FIG. 17 is obtained by adding the two P-type transistors 15 and 16 to the configuration of the level shift circuit of the sixth embodiment. In the P-type transistor 15, a source electrode is connected to the high voltage power source VDD, a drain electrode is connected to the P-type current mirror circuit 10P of the first current mirror circuit 10, and a gate electrode is connected to the output node O and receives the output signal O. Similarly, in the other P-type transistor 16, a source electrode is connected to the high voltage power source VDD, a drain electrode is connected to the P-type current mirror circuit 11P of the second current mirror circuit 11, and a gate electrode is connected to the inverted output node XO and receives the inverted output signal XO.

The P-type transistor 15 is made non-conducive on completion of the change from the L level to the H level of the potential of the output node O. At the time of non-conduction, the P-type transistor 15 interrupts the current path between the high voltage power source VDD and the P-type current mirror circuit 10P of the first current mirror circuit 10, and functions as a first current interrupting circuit for interrupting the current fed from the first current circuit 10. Similarly, the other P-type transistor 16 is made non-conducting on completion of the change from the L level to the H level of the potential of the inverted output node XO, at the time of non-conduction, interrupts the current path between the high voltage power source VDD and the P-type current mirror circuit 11P of the second current mirror circuit 11, and functions as a second current interrupting circuit for interrupting the current fed from the second current mirror circuit 11.

The operation of the embodiment will now be described. First, the basic operation will be described by using FIG. 16 in which the two P-type transistors 15 and 16 as a feature of the seventh embodiment are not provided.

Figure 16:
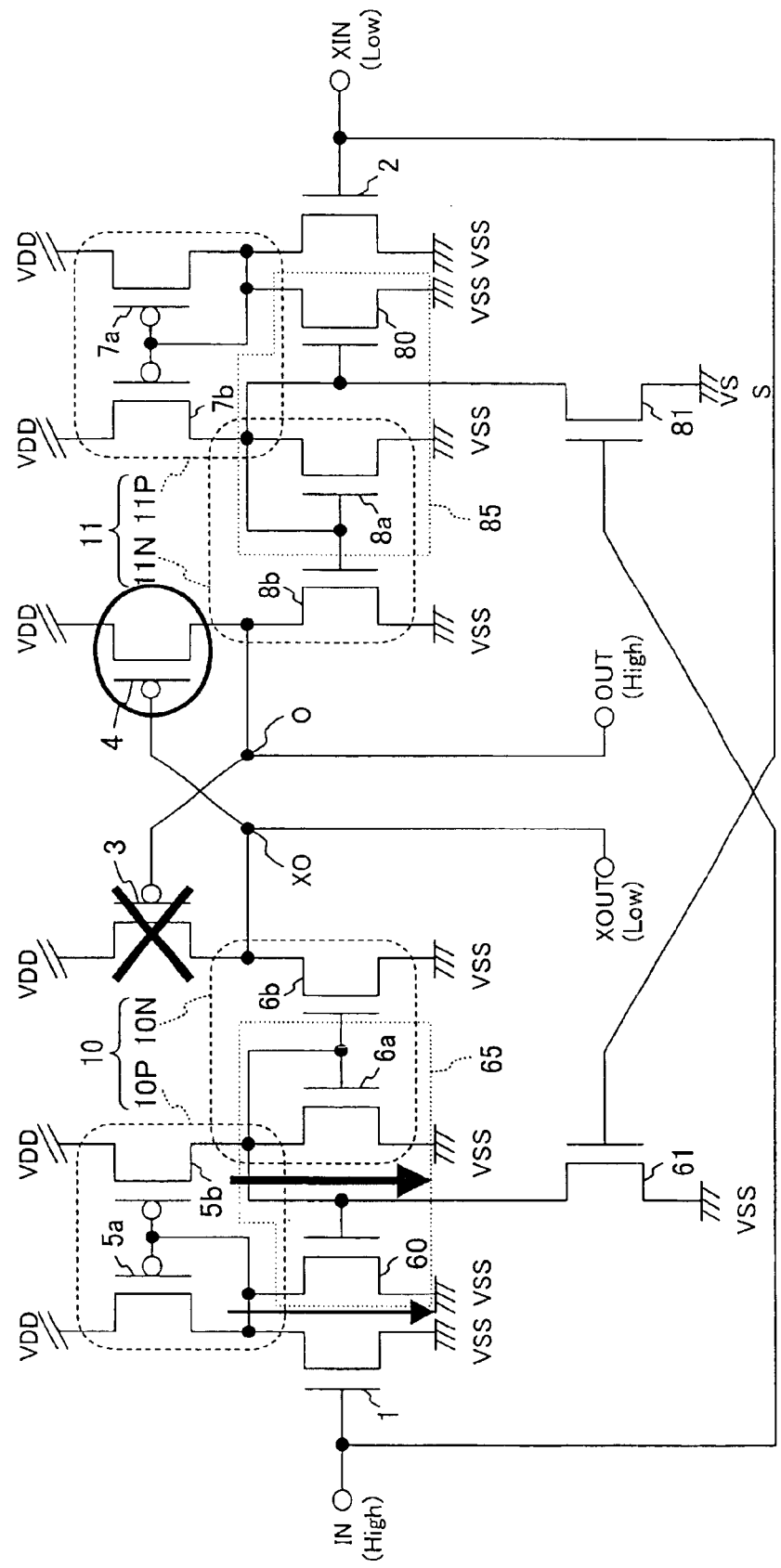
FIG. 16 is a diagram showing operation of the level shift circuit.

FIG. 16 shows the case where, for example, the input signal IN is at the H level and the inverted input signal XIN is at the L level. In this case, the output node O is at the H level, the inverted output node XO is at the L level, the first P-type transistor 3 is in the non-conducting state, and the second P-type transistor 4 is in the conducting state. Since the input signal IN is at the H level, the first N-type signal input transistor 1 is made conducting. In the first current mirror circuit 10, current flows from the P-type transistor 5a in the P-type current mirror circuit 10P via the first N-type signal input transistor 1 as shown by a thin arrow in the diagram. An amplified current flows from the other P-type transistor 5b via the N-type transistor 6a of the N-type current mirror circuit 10N as shown by a thick arrow. Since the first P-type transistor 3 is in the non-conducting state, the amplified current passed via the other N-type transistor 6b does not flow in the N-type current mirror circuit 10N. On the other hand, since the inverted input signal XIN is at the L level, and the second N-type signal input transistor 2 is in the non-conducting state, the second current mirror circuit 11 does not operate and the amplified current does not flow. Therefore, in the level shift circuit of FIG. 16, in the steady state in which the input signal IN is at the H level, the P-type current mirror circuit 10P in the first current mirror circuit 10 uselessly passes the stationary current.

Figure 18:
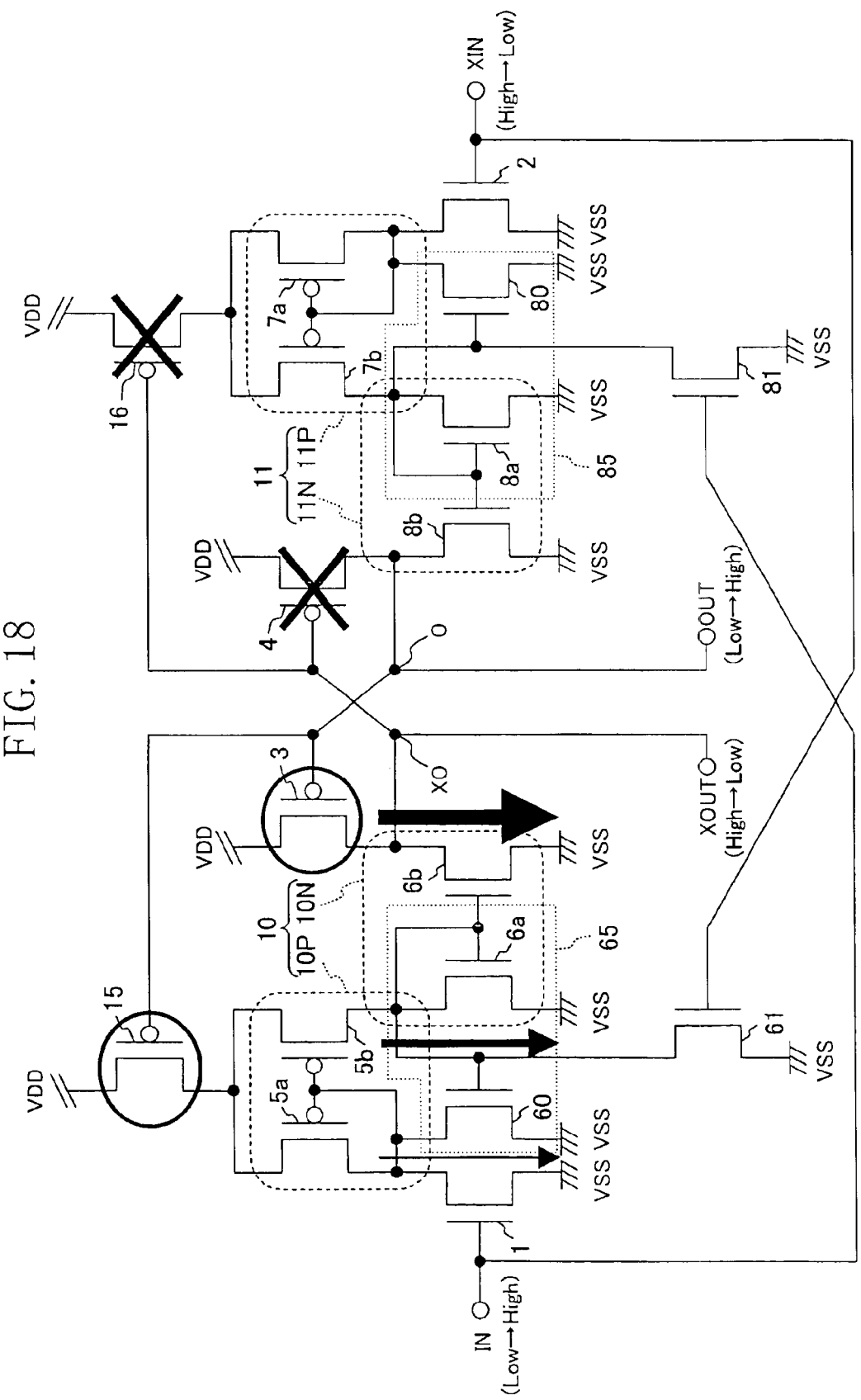
FIG. 18 is a diagram showing operation performed at the time of transition in which the input signal changes to the H level and the inverted input signal changes to the L level in the level shift circuit.

In contrast, in the level shift circuit shown in FIG. 17, such stationary current can be interrupted as will be described in detail hereinbelow. A case where the input signal IN is at the H level like the above-described case will be described. As shown in FIG. 18, first, when the input signal IN is at the L level before it changes to the H level, the output node O is at the L level, and the inverted output node XO is at the H level. Accordingly, the first P-type transistor 3 is in the conducting state and the second P-type transistor 4 is in the non-conducting state. Since the output node O is at the L level, the P-type transistor (first current interrupting circuit) 15 is in the conducting state. Since the inverted output node O is at the H level, the P-type transistor (second current interrupting circuit) 16 is in the non-conducting state. When the input signal IN changes to the H level in the circumstances, since both of the P-type transistor (first current interrupting circuit) 15 and the first P-type transistor 3 are in the conducting state, with a shift to the conducting state of the first N-type signal input transistor 1, the first current mirror circuit 10 operates to amplify the current flowing in the first N-type transistor 1 by the predetermined number α×β of times. Therefore, the same operation as that of the level shift circuit shown in FIG. 15 is assured. In the circumstances, the inverted input signal XIN changes from the H level to the L level. Since the second P-type transistor 4 and the P-type transistor (second current interrupting circuit) 16 are in the non-conducting state, the second current mirror circuit 11 does not operate.

After completion of a change to the H level of the input signal IN and a change to the L level of the inverted input signal XIN, the change to the H level of the output node O is finished, and the P-type transistor (first current interrupting circuit) 15 is made non-conducting. Consequently, the current path from the high voltage source VDD to the P-type current mirror circuit 10P of the first current mirror circuit 10 is interrupted, and the current fed from the P-type current mirror 10P is interrupted. Similarly, on completion of the change to the H level of the output node O, the first P-type transistor 3 is made non-conducting, so that the current path from the high voltage source VDD to the N-type current mirror circuit 10N of the first current mirror circuit 10 is interrupted, and the current fed from the N-type current mirror circuit 10N is interrupted. Therefore, in the embodiment, when the input signal IN enters the steady state of the H level, the P-type current mirror circuit 10P in the first current mirror circuit 10 can be reliably prevented from passing steady current uselessly. Thus, power consumption can be reduced.

Figure 19:
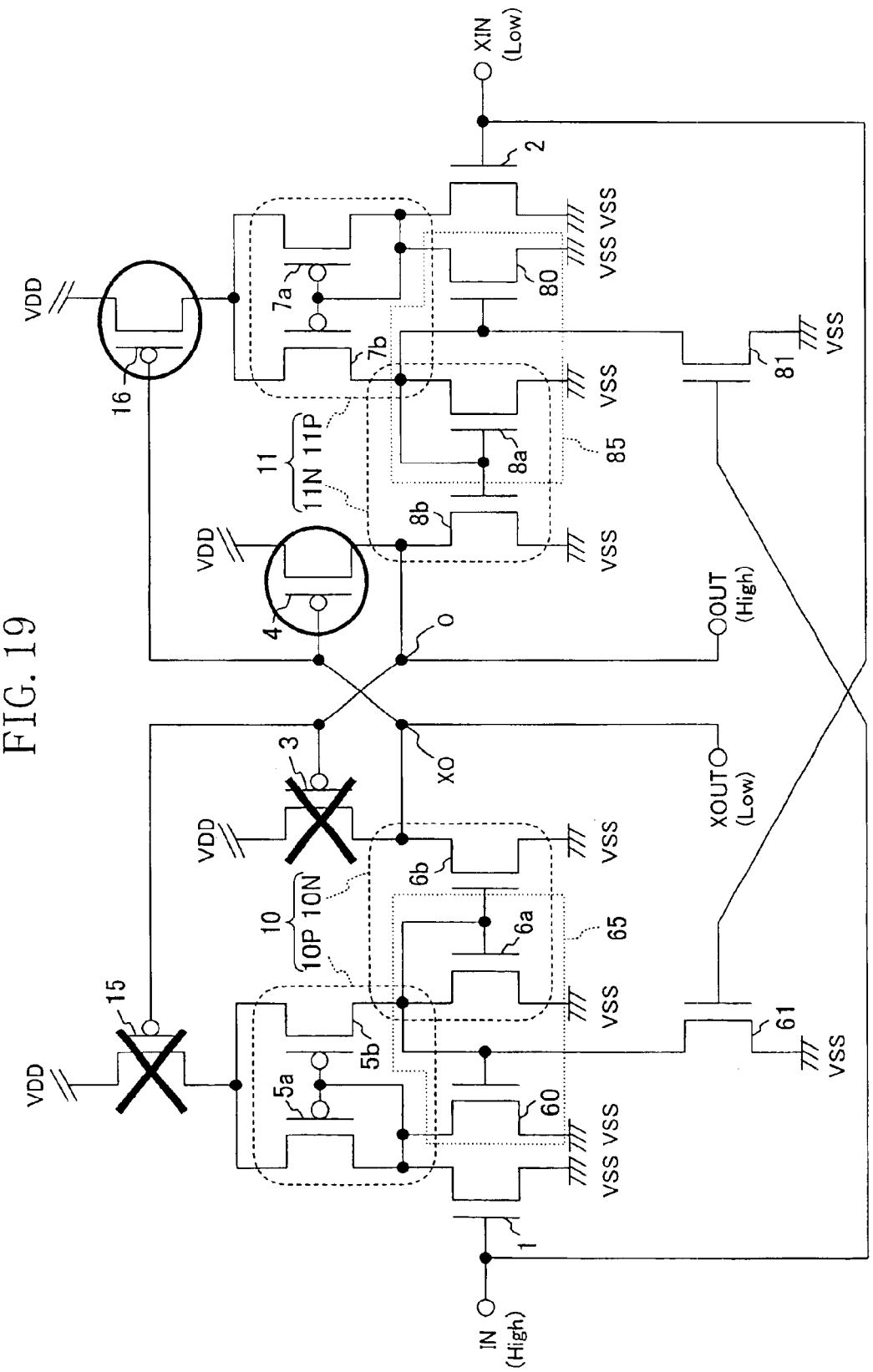
FIG. 19 is a diagram showing operation performed after a change to the H level of the input signal and a change to the L level of the inverted input signal are finished in the level shift circuit.

In the case where the input signal IN enters the stationary state of the H level, the inverted input signal XIN enters the stationary state of the L level, and the inverted output node XO enters the stationary state of the L level. At this time, as shown in FIG. 19, the second P-type transistor 4 and the P-type transistor (second current interrupting circuit) 16 enter the conducting state and it is prepared to enable the amplifying operation of the second current mirror circuit 11 to be performed when the inverted input signal XIN changes to the H level next.

Although the case where the input signal IN enters the stationary state of the H level has been described above, the operation in the case where the inverted input signal XIN enters the stationary state of the H level is similar to the above.

Also in the embodiment, obviously, either the output signal O or the inverted output signal XO may be output to the outside.

Embodiment 8

Figure 22:
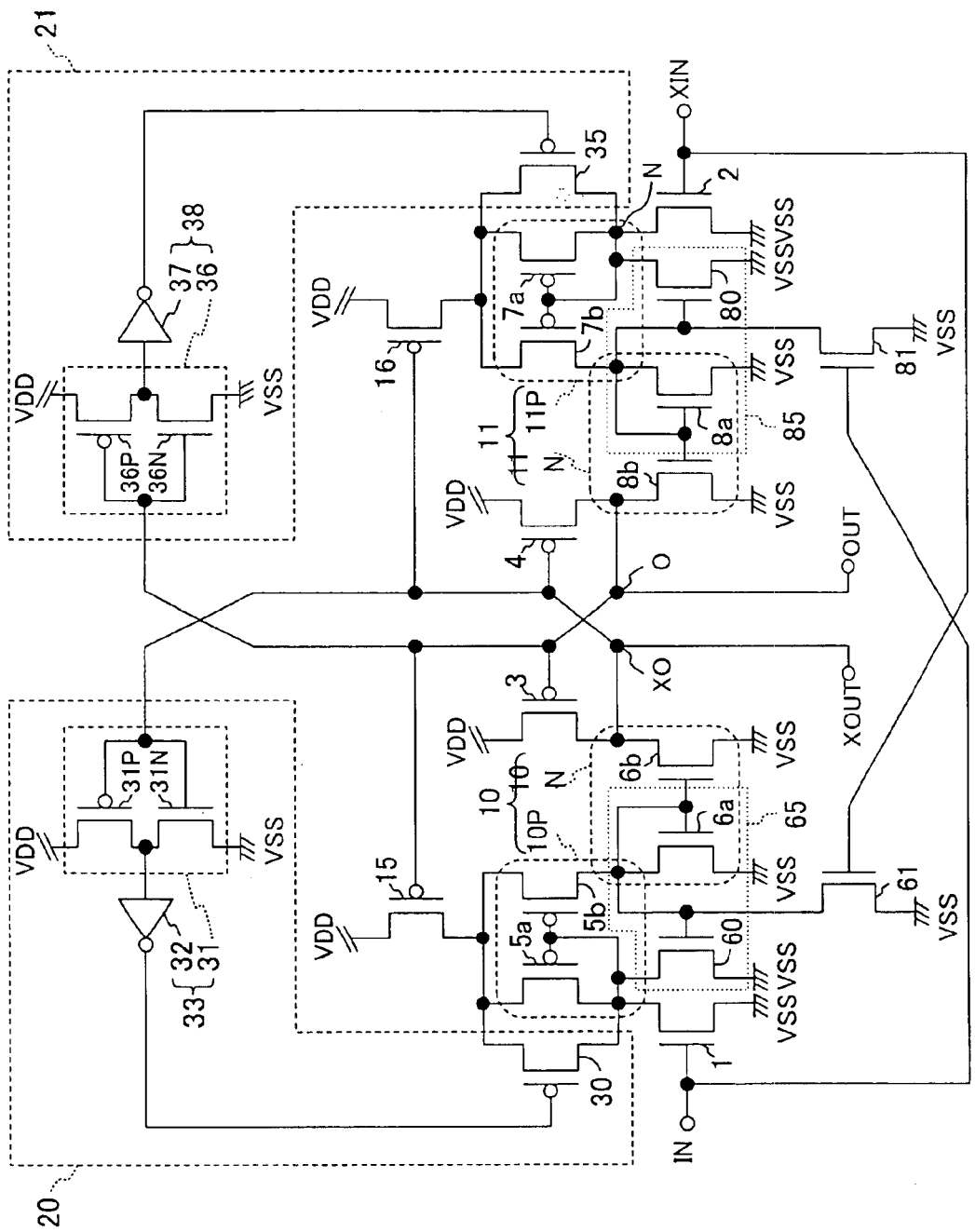
FIG. 22 is a diagram showing the configuration of a level shift circuit of an eighth embodiment of the invention.

FIG. 22 shows a level shift circuit of an eighth embodiment of the invention.

The level shift circuit of FIG. 22 is obtained by further improving the level shift circuit of the seventh embodiment shown in FIG. 17. Specifically, the level shift circuit of FIG. 22 is obtained by adding the first and second change speed accelerating circuits 20 and 21 to the level shift circuit of FIG. 17. The first and second change speed accelerating circuits 20 and 21 are to accelerate change speed from the L level to the H level of the inverted output node XO and the output node O as will be described later.

The first change speed accelerating circuit 20 includes the first P-type transistor 30 connected in parallel with the P-type transistor 5a on the input side as a component of the P-type current mirror circuit 10P of the first current mirror circuit 10, and the first buffer circuit 33 constructed by the two inverter circuits 31 and 32. The first P-type transistor 30 is set to have a large gate width and extremely high current driving capability relative to the parallel-connected input side P-type transistor 5a of the P-type current mirror circuit 10P. In the first buffer circuit 33, the inverter circuit 31 has the P-type transistor 31P and the N-type transistor 31N which are connected in series between the high voltage source VDD and the ground. The inverted output node XO is connected to both of the gate electrodes of the transistors 31P and 31N, the other inverter circuit 32 is connected to the output side (the connection point between the drain electrode of the P-type transistor 31P and the drain electrode of the N-type transistor 31N), and the output side of the inverter circuit 32 is connected to the gate electrode of the P-type transistor 30.

Similarly, the second change speed accelerating circuit 21 has the second P-type transistor 35 connected in parallel with the P-type transistor 7a on the input side as a component of the P-type current mirror circuit 11P of the second current mirror circuit 11, and the second buffer circuit 38 constructed by the two inverter circuits 36 and 37. Since the connecting relation among the devices is similar to that in the first change speed accelerating circuit 20, the description will now be repeated.

The operation of the embodiment will now be described. First, a tendency that a change from the L level to the H level lags behind a change from the H level to the L level in the output node O and the inverted output node XO in the configuration of FIG. 17 showing the seventh embodiment will be described.

Figure 20:
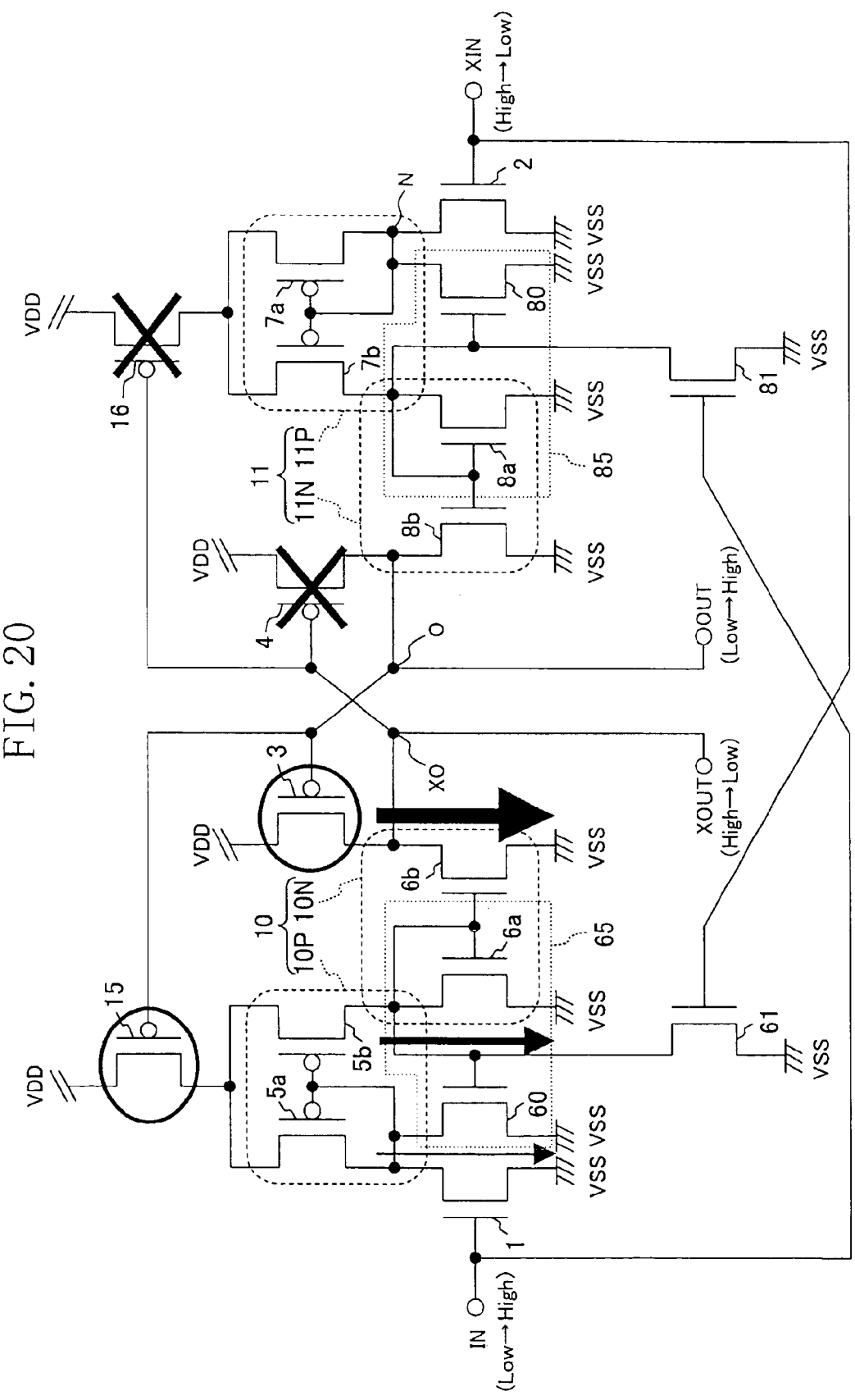
FIG. 20 is a diagram showing operation performed at the time of transition in which the input signal changes to the H level and the inverted input signal changes to the L level in the level shift circuit.

The tendency will be described with reference to FIG. 20. FIG. 20 shows that, when the input signal IN changes from the L level to the H level and the inverted input signal XIN changes from the H level to the L level, the change to the H level of the output node O lags behind the change to the L level of the inverted output node XO.

Figure 21:
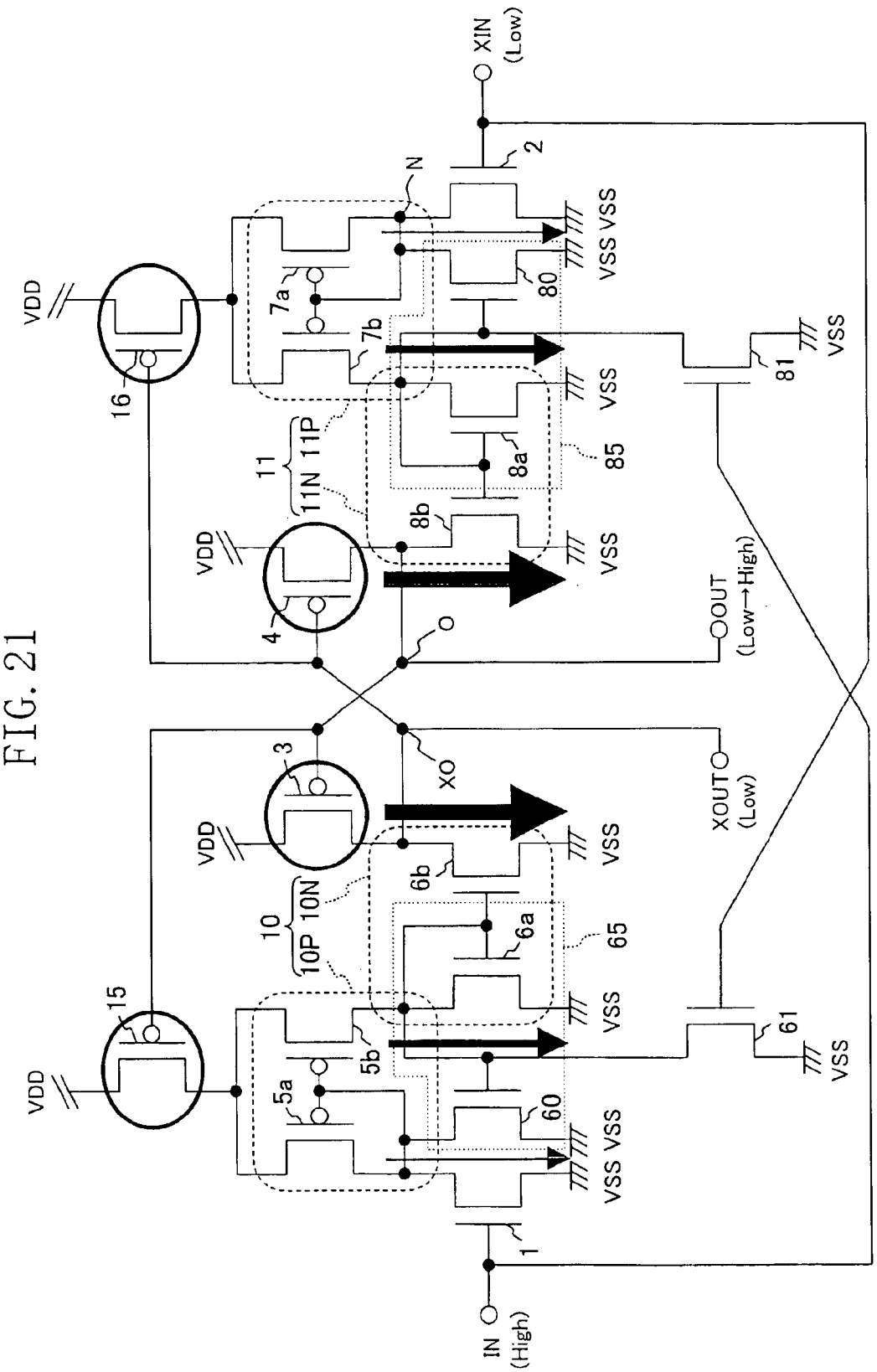
FIG. 21 is a diagram illustrating that a change from the L level to the H level of an output node tends to delay in the level shift circuit.

In FIG. 20, with a change to the H level of the input signal IN, the inverted output node XO changes quickly from the H level to the L level by the current amplification action of the first current mirror circuit 10 as described above. Consequently, the second P-type transistor 4 and the P-type transistor (second current interrupting circuit) 16 shift from the non-conducting state shown in FIG. 20 to the conducting state shown in FIG. 21. As a result, the current path from the high voltage source VDD to the P-type current mirror circuit 11P of the second current mirror circuit 11 is constructed via the P-type transistor (second current interrupting circuit) 21. At this time, the inverted input signal XIN is at the L level and the second N-type transistor 2 is in the non-conducting state, so that current starts flowing so as to charge parasitic capacitance of the node N (the drain electrode of the P-type transistor 7a and the gate electrodes of the P-type transistors 7a and 7b) via the input-side P-type transistor 7a as a component of the P-type current mirror circuit 11P of the second current mirror circuit 11. Until the potential of the node N rises to the potential by which the P-type transistors 7a and 7b are made non-conducting, the current keeps on flowing. The P-type transistor 7a on the input side of the P-type current mirror circuit 11P has a smaller width and low current driving capability as compared with the output-side P-type transistor 7b as understood also from the equation from the viewpoint of the function of the current mirror circuit, so that the flowing period of the current is long. In the period in which the current flows, the second current mirror circuit 11 passes amplified current from the output-side N-type transistor 8b in the N-type current mirror circuit 11N. In association with the change to the L level of the inverted output node XO, the second P-type transistor 4 is made conducting, current is supplied from the high voltage source VDD, and the output node O changes from the L level to the H level. However, due to the amplified current from the N-type transistor 5b to the ground, the change to the H level tends to delay.

In the embodiment, however, such a tendency can be eliminated by the first and second change speed accelerating circuits 20 and 21 as will be described hereinbelow.

Figure 23:
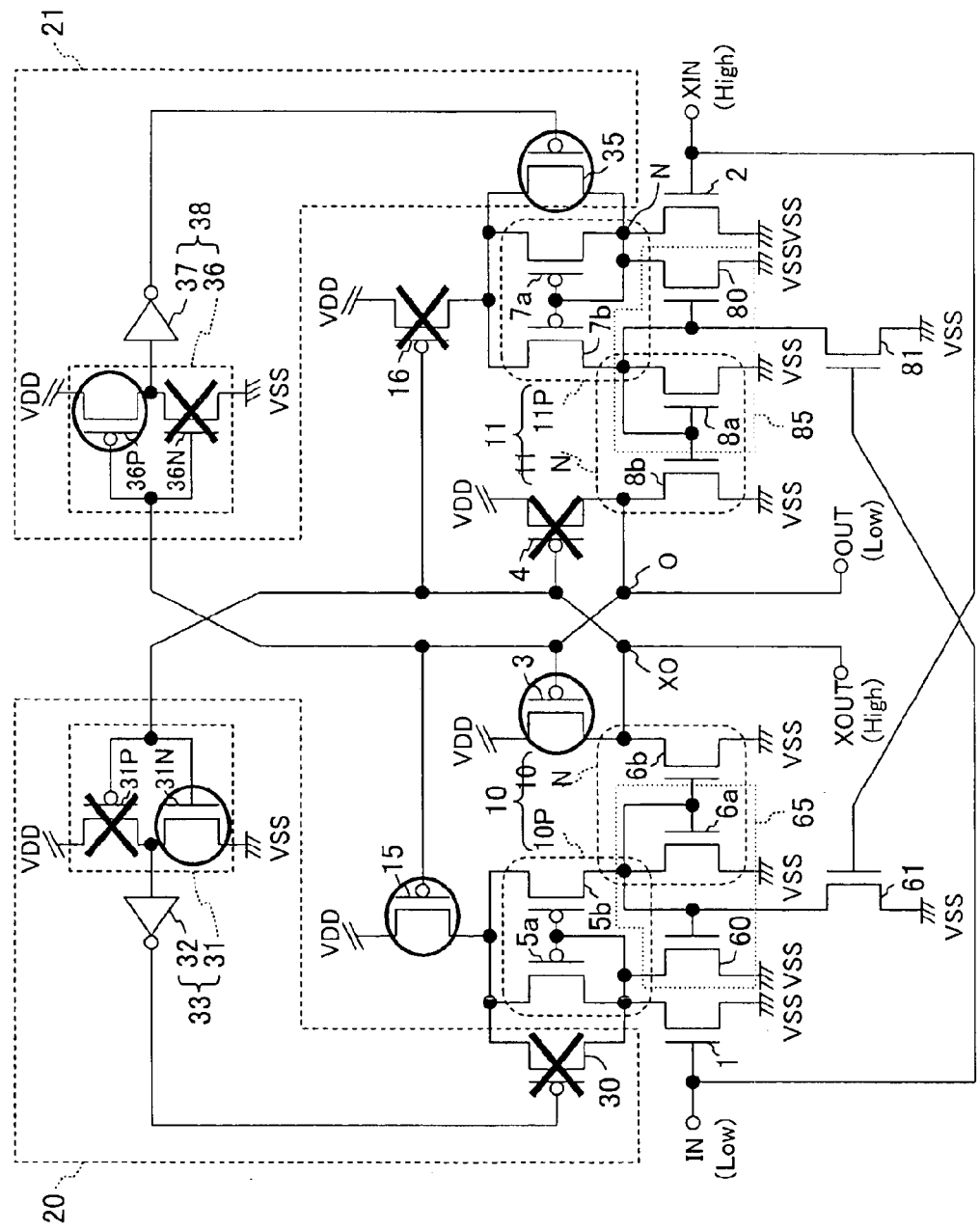
FIG. 23 is a diagram showing operation performed in the case where the input signal is at the L level and the inverted input signal is at the H level in the level shift circuit.

In a manner similar to the above, the case where the input signal IN changes from the L level to the H level and the inverted input signal XIN changes from the H level to the L level will be described. First, as shown in FIG. 23, when he input signal IN is at the L level and the inverted input signal XIN is at the H level, the output node O is at the L level, and the inverted output node XO is at the H level. Consequently, in the second change speed accelerating circuit 21, a P-type transistor 36P of the inverter circuit 36 enters the conducting state, the N-type transistor 36N enters the non-conducting state, the gate potential of the P-type transistor 35 becomes the L level, and the P-type transistor 35 enters the conducting state.

Figure 24:
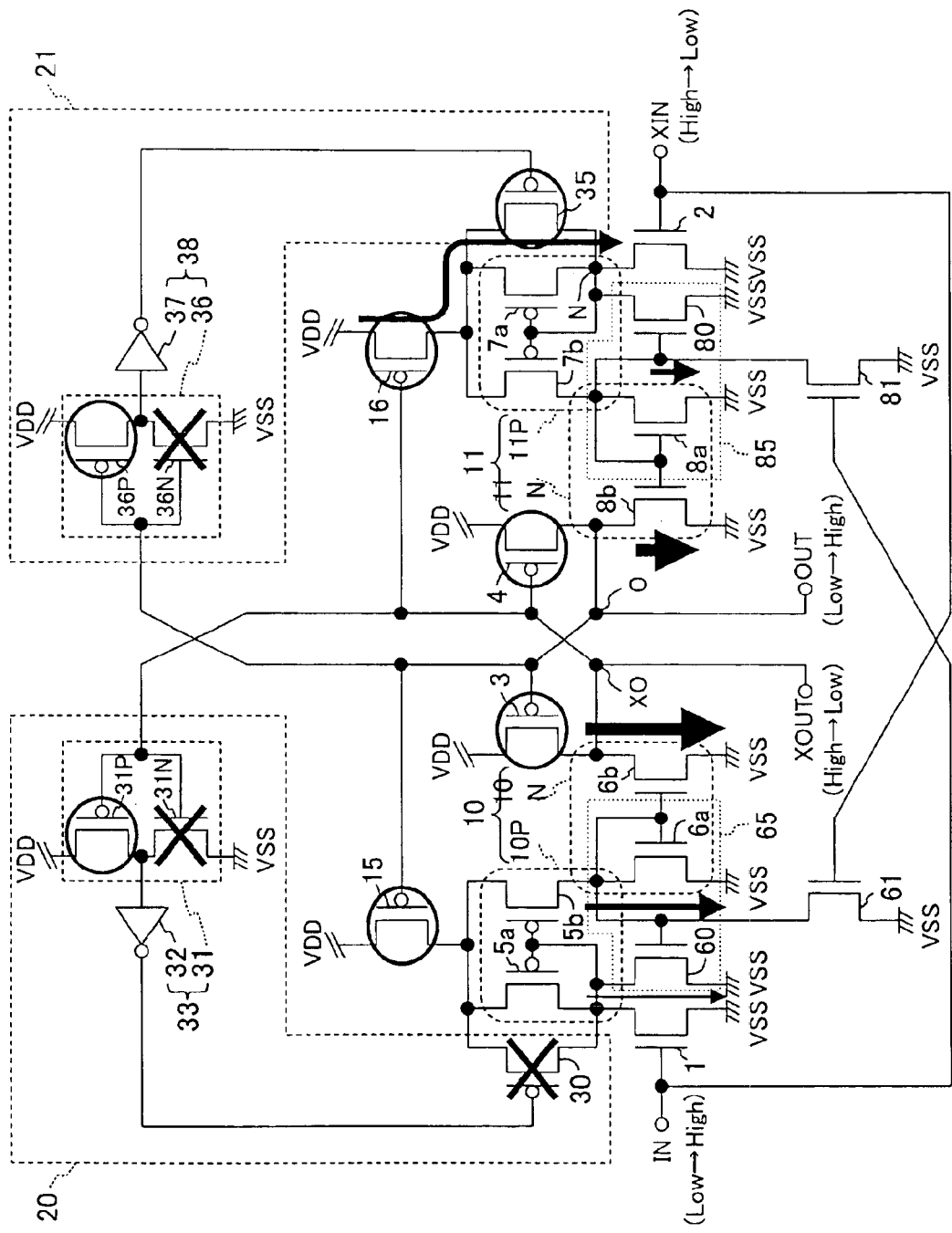
FIG. 24 is a diagram showing operation performed at the transient time in which the input signal changes from the L level to the H level and the inverted input signal changes from the H level to the L level in the level shift circuit.

After that, as shown in FIG. 24, when the input signal IN changes to the H level and the inverted input signal XIN changes to the L level, the inverted output node XO changes to the L level by the amplification action of the first current mirror circuit 10 as described above, and the second P-type transistor 4 and the P-type transistor (second current interrupting circuit) 16 are made conducting. Therefore, a large current flows from the high voltage source VDD to the node N via the P-type transistor (second current interrupting circuit) 16 and, further, the second P-type transistor 35 of high capability of the second change speed accelerating circuit 21 to charge the parasitic capacitance of the node N at high speed. As a result, the period until the two P-type transistors 7a and 7b of the P-type current mirror circuit 11P become non-conducting is shortened. Accordingly, the supply time of the amplified current passed from the output-side N-type transistor 5b of the N-type current mirror circuit 11N is also shortened, time of change from the L level to the H level of the output node O is also shortened, and the change speed to the H level of the output node O is accelerated.

Figure 25:
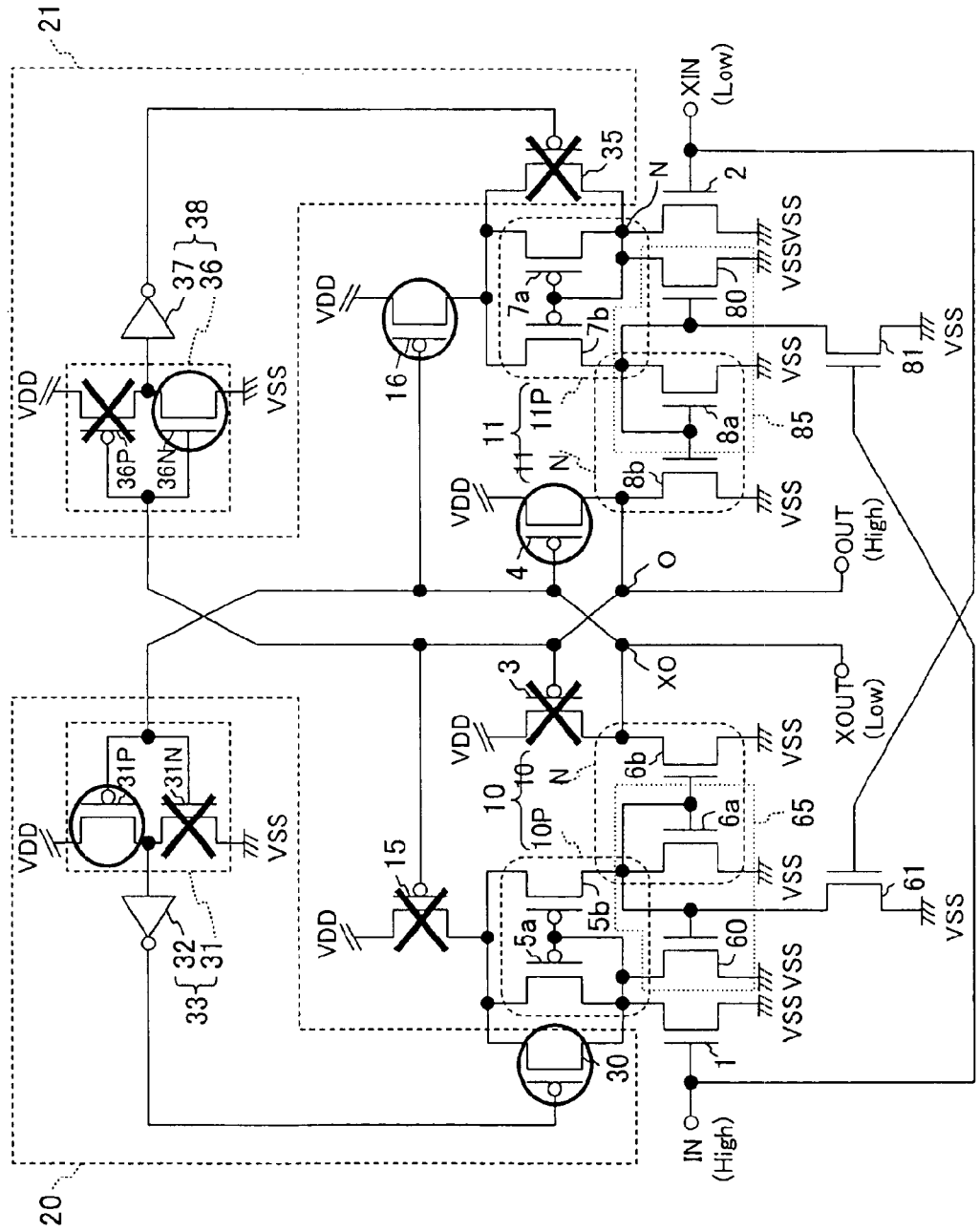
FIG. 25 is a diagram showing operation performed when a change to the H level of the input signal and a change to the L level of the inverted input signal are finished in the level shift circuit.

When the output node O changes to the H level, as shown in FIG. 25, in the second change speed accelerating circuit 21, the P-type transistor 36P of the inverter circuit 36 enters a non-conducting state, the N-type transistor 36N enters a conducting state, the potential of the gate electrode of the second P-type transistor 35 becomes the H level, and the second P-type transistor 35 enters a non-conducting state. In such a manner, it is prepared for a next change to the H level of the inverted input signal XIN.

Although the operation performed when the output node O changes to the H level has been described above, the operation is similarly performed also when the inverted output node XO changes to the H level.

Therefore, also in the embodiment, the change time from the L level to the H level of the output node O and the inverted output node XO can be effectively shortened.

Obviously, also in the embodiment, either the output signal O of the output node 0 or the inverted output signal XO of the inverted output node XO may be output to the outside. If sufficient delay occurs, it is sufficient to use one of the first and second buffer circuits 33 and 38.

Embodiment 9

Figure 26:
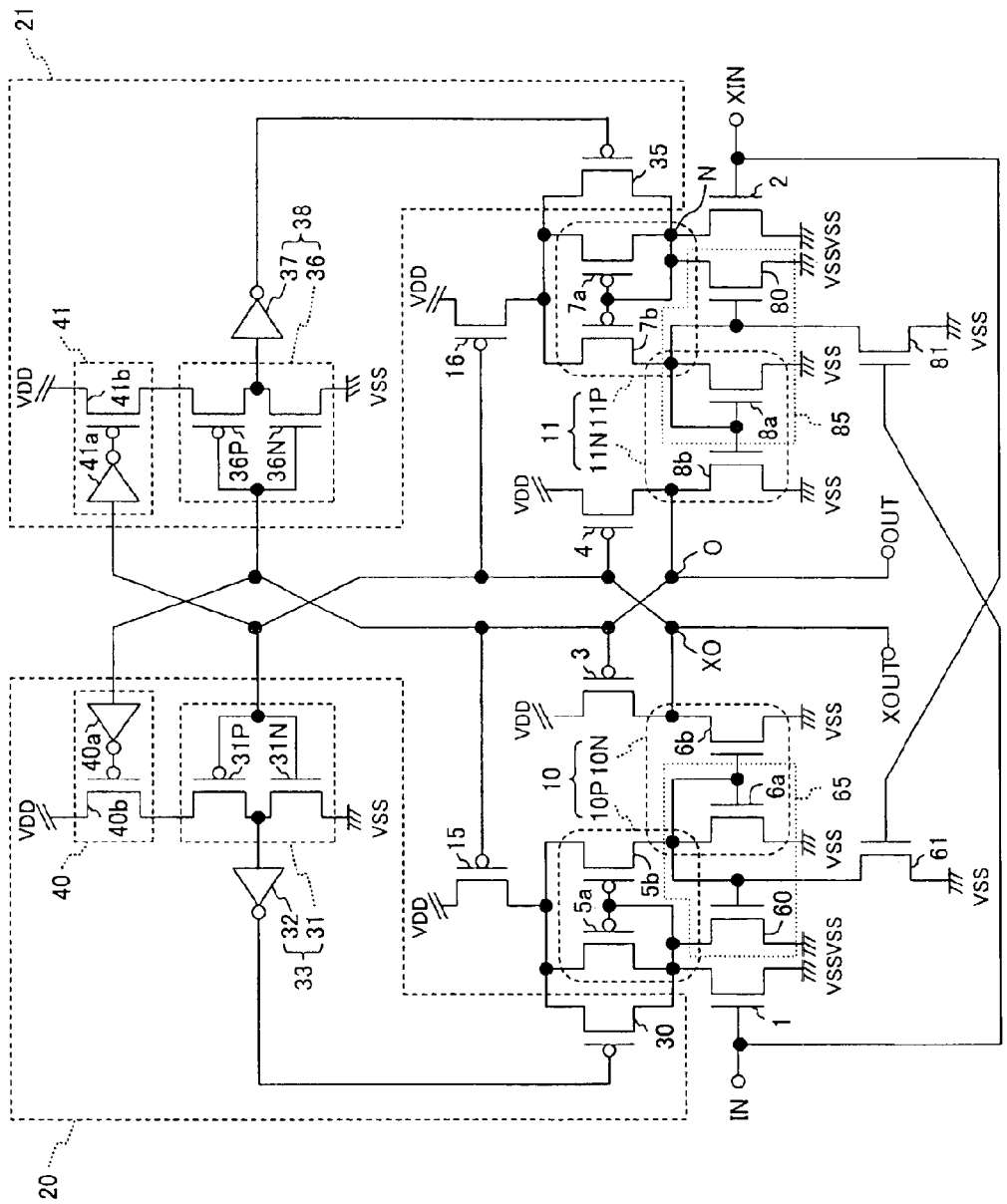
FIG. 26 is a diagram showing the configuration of a level shift circuit of a ninth embodiment of the invention.

FIG. 26 shows a level shift circuit of a ninth embodiment of the invention.

The level shift circuit of FIG. 26 is obtained by improving the level shift circuit of the eighth embodiment. Concretely, the first and second change speed accelerating circuits 20 and 21 of the level shift circuit shown in FIG. 22 are improved.

To be specific, in the level shift circuit of FIG. 26, the first control circuit 40 is added in the first change speed accelerating circuit 20. The first control circuit 40 has the inverter 40a connected to the output node O and the P-type transistor 40b having a gate electrode for receiving an output of the inverter 40a. In the P-type transistor 40b, a source electrode is connected to the high voltage source VDD, and a drain electrode is connected to the source electrode of the P-type transistor 31P of the inverter circuit 31 as a component of the first buffer circuit 33. Therefore, in the first control circuit 40, after the signal of the output node O, that is, the output signal O changes from the L level to the H level, the P-type transistor 40a enters a conducting state, the high voltage power source VDD is connected to the first buffer circuit 33, and the operation of the buffer circuit 33 is permitted.

On the other hand, in the second change speed accelerating circuit 21, the second control circuit 41 is added. The second control circuit 41 has the inverter 41a connected to the inverted output node XO and the P-type transistor 41b having a gate electrode for receiving an output of the inverter 41a. The source electrode of the P-type transistor 41b is connected to the high voltage source VDD, and the drain electrode is connected to the source electrode of the P-type transistor 36P of the inverter circuit 36 as a component of the second buffer circuit 38. Therefore, in the second control circuit 41, after the inverted output signal XO changes from the L level to the H level, the P-type transistor 41a enters a conducting state, the high voltage power source VDD is connected to the second buffer circuit 38, and the operation of the buffer circuit 38 is permitted.

The ninth embodiment produces the following effect in comparison with the eighth embodiment. In the eighth embodiment, as shown in FIG. 24, by a change from the H level to the L level of the inverted output node XO, the P-type transistor 16 is made conducting, and a large current is supplied to the parasitic capacitance of the node N from the high voltage source VDD via the large-capacity P-type transistor 35 in the second change speed accelerating circuit 21. At that time, the change from the H level to the L level of the inverted output node XO is propagated to the gate electrode of the first P-type transistor 30 via the first buffer circuit 33 of the first change speed accelerating circuit 20 after predetermined delay time, and the first P-type transistor 30 is made conducting. In this case, if delay time of the first buffer circuit 33 is short, before the potential of the inverted output node XO is determined as the L level, the first P-type transistor 30 of the first change speed accelerating circuit 20 is made conducting and a large current from the high voltage source VDD charges the drain electrode of the first N-type transistor 1 via the first P-type transistor 30. Accordingly, longer time for determining the L level from the H level of the inverted output node XO is necessary and delay occurs in determination of the L level. This problem can be solved by setting long delay time of the first buffer circuit 33. However, if the delay time is set to be too long, the cycle of the input signal IN is regulated by the delay time, and it becomes necessary to set the cycle of the input signal IN to be long.

In contrast, tin the ninth embodiment, only after the potential of the output node O changes to the H level, the first control circuit 40 permits the operation of the first buffer circuit 33 in the first change speed accelerating circuit 20. Therefore, conduction of the first P-type transistor 30 in the first change speed accelerating circuit 20 can be controlled by both the change to the H level of the output node O and the change to the L level of the inverted output node XO, and occurrence of a delay in determination of the L level of the inverted output node XO can be effectively controlled. In a manner similar to the above, delay in determination of the L level of the output node O can be also suppressed.

Obviously, also in the ninth embodiment, either the output signal O of the output node O or the inverted output signal XO of the inverted output node XO may be output to the outside.

Embodiment 10

A tenth embodiment of the invention will now be described.

Figure 27:
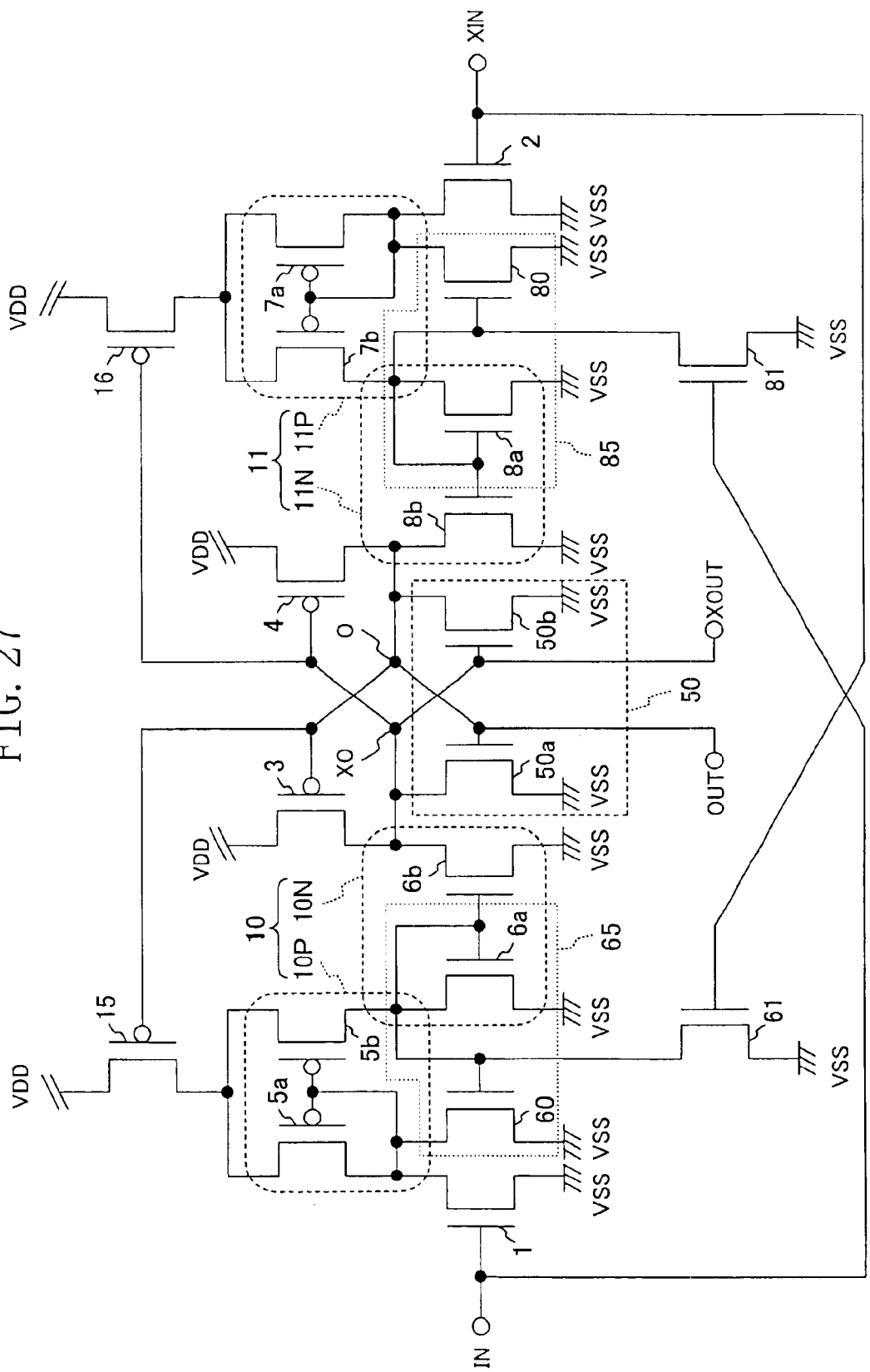
FIG. 27 is a diagram showing the configuration of a level shift circuit of a tenth embodiment of the invention.

FIG. 27 shows a level shift circuit of the tenth embodiment. The level shift circuit of the diagram is obtained by adding the stabilizing circuit 50 to the level shift circuit of FIG. 17.

The stabilizing circuit 50 has the first and second N-type transistors 50a and 50b. The first N-type transistor 50a has a gate electrode connected to the output node O, a drain electrode connected to the inverted output node XO, and a source electrode connected to the ground. On the other hand, the second N-type transistor 50b has a gate electrode connected to the inverted output node XO, a drain electrode connected to the output node O, and a source electrode connected to the ground.

In the level shift circuit shown in FIG. 17, in the case where the potentials of both of the input signal IN and the inverted input signal XIN are indeterminate in the initial state where the high voltage source VDD starts to be supplied to the level shift circuit, all of the first and second N-type transistors 1 and 2 and the two P-type transistors 3 and 4 tend to enter a conducting state. A feed-through current flows from the high voltage source VDD to the ground via the N-type transistors 6b and 8b of the N-type current mirror circuits 10N and 11N, and the potentials of the output node O and the inverted output node XO also become indeterminate. The feed-through current transiently continues until the input signal IN and the inverted input signal XIN are determined at a predetermined L or H level.

In the embodiment, however, for example, when the potential of the inverted output node XO is higher than that of the output node O, a tendency of conduction of the second N-type transistor 50b of the stabilizing circuit 50 is increased and a tendency of non-conduction of the second P-type transistor 4 is increased, thereby further decreasing the potential of the output node O. As the potential of the output node O decreases, a tendency of non-conduction of the first N-type transistor 50a in the stabilizing circuit 50 is increased and a tendency of conduction of the first P-type transistor 3 is increased, thereby further increasing the potential of the inverted output node XO. By such a positive feedback, the output node O is determined at the L level and the inverted output node XO is determined at the H level early.

Therefore, in the embodiment, even if the input signal IN and the inverted input signal XIN are indeterminate in the initial state, the potentials of the output node O and the inverted output node XO can be determined at the L or H level early, and a transient feed-through current flowing until the determination can be effectively reduced.

Modifications

Figure 28:
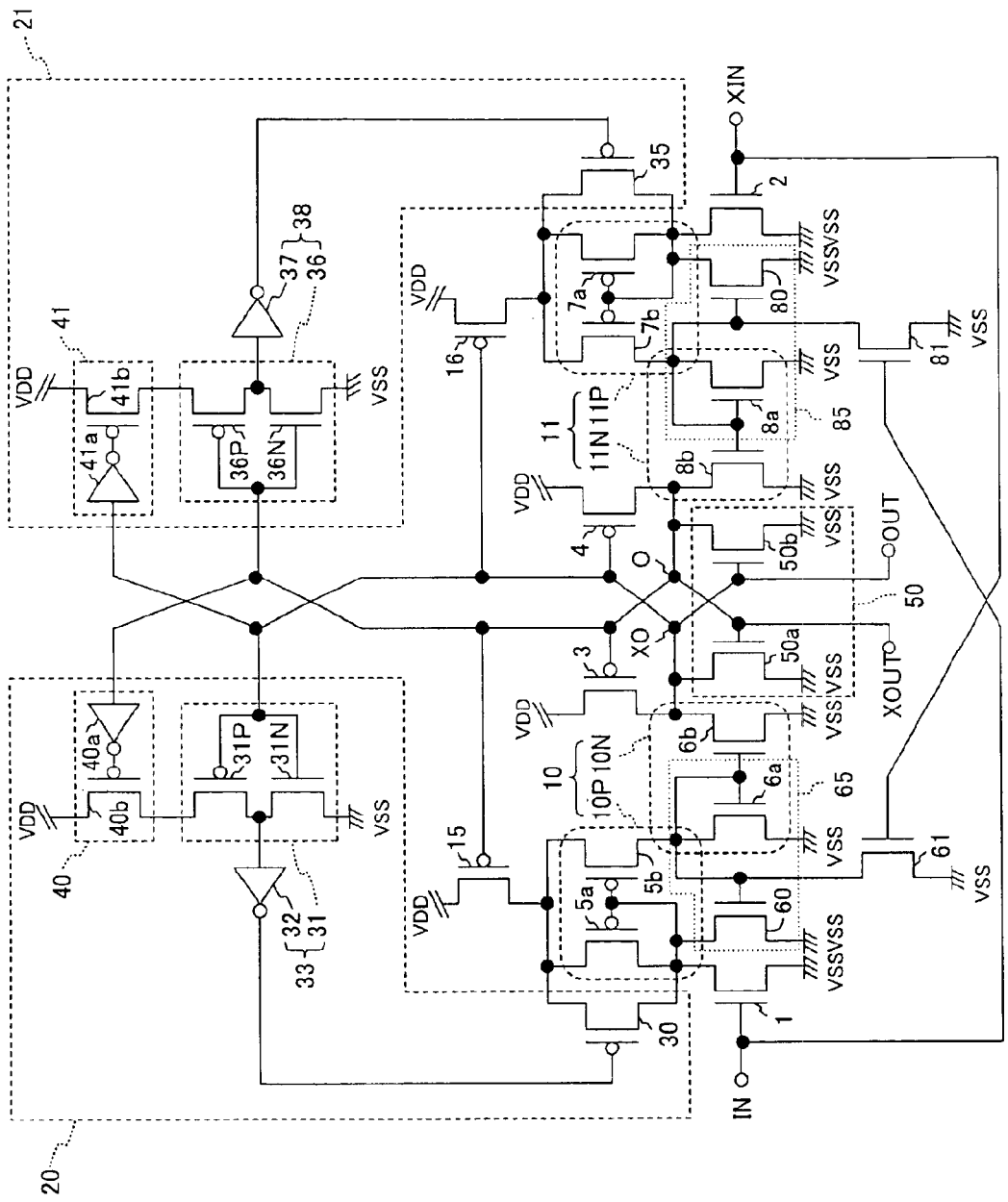
FIG. 28 is a diagram showing the configuration of a level shift circuit as a modification of the tenth embodiment of the invention.
Figure 29:
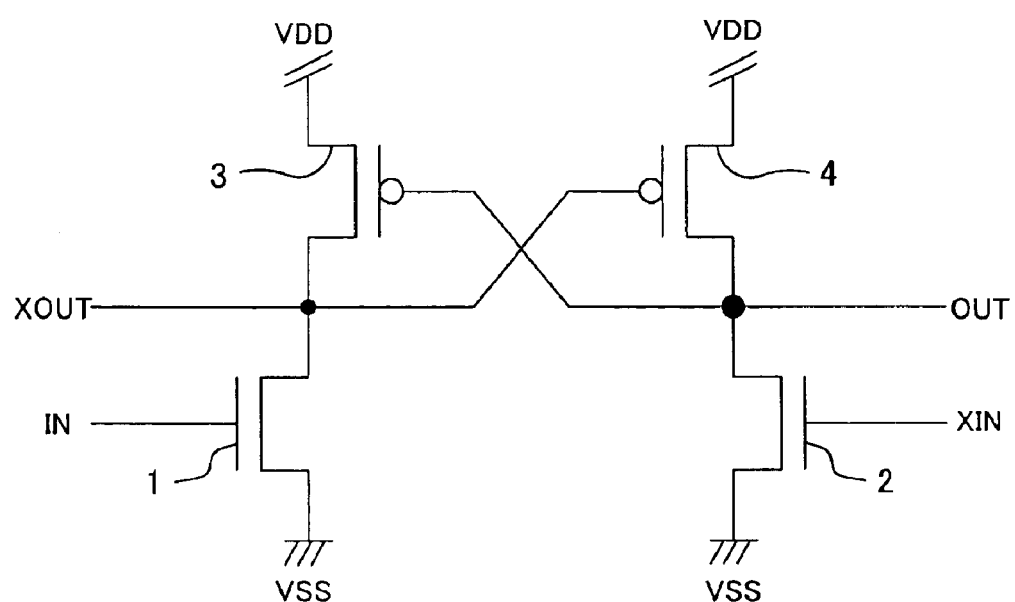
FIG. 29 is a diagram showing the configuration of a conventional level shift circuit.

FIG. 28 shows a modification of the level shift circuit of the tenth embodiment.

In the tenth embodiment, the stabilizing circuit 50 is added to the level shift circuit of FIG. 17. In the modification, the stabilizing circuit 50 is added to the level shift circuit of the ninth embodiment. Since the other configuration is similar to that of FIG. 27, the description will not be repeated.

Although the level shift circuit having the P-type transistors 3 and 4 has been described in each of the sixth to tenth embodiments, the invention is not limited to the configuration but can be applied to level shift circuits of various configurations. It is sufficient for the level shift circuit to have at least the first and second N-type transistors 1 and 2 for signal input.

As described above, in the invention, even if an input signal is a low voltage, since the current driving capability is increased by using the current mirror circuit, level shifting can be carried out at high speed with low power consumption. The level shift circuit is useful for an LSI requested to perform a low-voltage operation.

What is claimed is:

1. A level shift circuit having a pair of an input terminal and an inverted input terminal and a pair of an output node and an inverted output node, for receiving an input signal and an inverted input signal by said input terminal and said inverted input terminal, for shifting an amplitude level of said input signal and said inverted input signal to a higher amplitude level, and for transmitting an output signal having the shifted amplitude level and an inverted output signal obtained by inverting the output signal to said output node and said inverted output node, respectively, comprising:
   a first N-type signal input transistor having a gate electrode to which said input terminal is connected;
   a second N-type signal input transistor having a gate electrode to which said inverted input terminal is connected;
   a first current mirror circuit disposed between said first N-type transistor and said inverted output node, for amplifying current flowing in said first N-type transistor by predetermined number of times, and drawing out the amplified current from said inverted output node; and
   a second current mirror circuit disposed between said second N-type transistor and said output node, for amplifying current flowing in said second N-type transistor by predetermined number of times, and drawing out the amplified current from said output node.

2. The level shift circuit of claim 1, wherein each of said first and second current mirror circuits has at least a pair of a P-type current mirror circuit constructed by P-type transistors and an N-type current mirror circuit constructed by N-type transistors, the P-type and N-type current mirror circuits being cascaded.

3. The level shift circuit of claim 2, further comprising:
   a first current interrupting circuit connected to said first current mirror circuit, for interrupting the current fed from said first current mirror circuit after completion of a change in said output signal; and
   a second current interrupting circuit connected to said second current mirror circuit, for interrupting the current fed from said second current mirror circuit after completion of a change in said inverted output signal.

4. The level shift circuit of claim 3, wherein said first current interrupting circuit is constructed by a P-type transistor for receiving said output signal by its gate electrode; and
   said second current interrupting circuit is constructed by a P-type transistor for receiving said inverted output signal by its gate electrode.

5. The level shift circuit of claim 3, further comprising:
   a first change speed accelerating circuit connected in parallel with the P-type current mirror circuit of said first current mirror circuit, for accelerating speed of a change from the L level to the H level of said inverted output signal under control of the inverted output signal of said inverted output node; and
   a second change speed accelerating circuit connected in parallel with the P-type current mirror circuit of said second current mirror circuit, for accelerating speed of a change from the L level to the H level of said output signal under control of the output signal of said output node.

6. The level shift circuit of claim 5, wherein said first change speed accelerating circuit comprises:
   a first P-type transistor connected in parallel with the P-type current mirror circuit of said first current mirror circuit; and
   a first buffer circuit whose output side is connected to the gate electrode of said first P-type transistor and which is controlled by an inverted output signal of said inverted output node, and
   said second change speed accelerating circuit includes:
   a second P-type transistor connected in parallel with the P-type current mirror circuit of said second current mirror circuit; and
   a second buffer circuit whose output side is connected to the gate electrode of said second P-type transistor and which is controlled by an output signal of said output node.

7. The level shift circuit of claim 6, wherein said first change speed accelerating circuit further comprises a first control circuit for allowing operation of said first buffer circuit to be performed after a change in the output signal of said output node is finished and
   said second change speed accelerating circuit further comprises a second control circuit for allowing operation of said second buffer circuit to be performed after a change in the inverted output signal of said inverted output node is finished.

8. The level shift circuit of claim 1, further comprising a stabilizing circuit for determining and stabilizing a potential state of said output node and said inverted output node early in an initial state in which a power source starts to be supplied.

9. The level shift circuit of claim 8, wherein said stabilizing circuit has: a first N-type transistor whose gate electrode is connected to said output node, whose drain electrode is connected to said inverted output node, and whose source electrode is grounded; and
   a second N-type transistor whose gate electrode is connected to said inverted output node, whose drain electrode is connected to said output node, and whose source electrode is grounded.

10. The level shift circuit of claim 1, wherein at least one of an output signal of said output node and an inverted output signal of said inverted output node is output to the outside.

11. A level shift circuit having a pair of an input terminal and an inverted input terminal and a pair of an output node and an inverted output node, for receiving an input signal and an inverted input signal by said input terminal and said inverted input terminal, for shifting an amplitude level of said input signal and said inverted input signal to a higher amplitude level, and for transmitting an output signal having the shifted amplitude level and an inverted output signal obtained by inverting the output signal to said output node and said inverted output node, respectively, comprising:
   a first N-type signal input transistor having a gate electrode to which said input terminal is connected;
   a second N-type signal input transistor having a gate electrode to which said inverted input terminal is connected;

a first current mirror circuit having at least a set of a P-type current mirror circuit constructed by P-type transistors and an N-type current mirror circuit constructed by N-type transistors, the P-type and N-type current mirror circuits being cascaded, disposed between said first N-type transistor and said inverted output node, for amplifying current flowing in said first N-type transistor by predetermined number of times, and drawing out the amplified current from said inverted output node;

a second current mirror circuit having at least a set of a P-type current mirror circuit constructed by P-type transistors and an N-type current mirror circuit constructed by an N-type transistors, the P-type and N-type current mirror circuits being cascaded, disposed between said second N-type transistor and said output node, for amplifying current flowing in said second N-type transistor by predetermined number of times, and drawing out the amplified current from said output node;

a first N-type current feedback transistor connected in parallel with said first N-type signal input transistor and controlled by a potential at a connection point between the P-type current mirror circuit and the N-type current mirror circuit in said first current mirror circuit; and a second N-type current feedback transistor connected in parallel with said second N-type signal input transistor and controlled by a potential at a connection point between the P-type current mirror circuit and the N-type current mirror circuit in said second current mirror circuit.

12. The level shift circuit of claim 11, further comprising:

a third N-type transistor whose gate electrode is connected to said inverted input terminal, whose drain electrode is connected to the connection point between the p-type current mirror circuit and the N-type current mirror circuit in said first current mirror circuit, and whose source electrode is grounded; and a fourth N-type transistor whose gate electrode is connected to said input terminal, whose drain electrode is connected to the connection point between the P-type current mirror circuit and the N-type current mirror circuit in said second current mirror circuit, and whose source electrode is grounded.

13. The level shift circuit of claim 11, further comprising:

a first current interrupting circuit connected to said first current mirror circuit, for interrupting the current fed from said first current mirror circuit after completion of a change in said output signal; and a second current interrupting circuit connected to said second current mirror circuit, for interrupting the current fed from said second current mirror circuit after completion of a change in said inverted output signal.

14. The level shift circuit of claim 13, wherein said first current interrupting circuit is constructed by a P-type transistor for receiving said output signal by its gate electrode; and said second current interrupting circuit is constructed by a P-type transistor for receiving said inverted output signal by its gate electrode.

15. The level shift circuit of claim 13, further comprising:

a first change speed accelerating circuit connected in parallel with the P-type current mirror circuit of said first current mirror circuit, for accelerating speed of a change from the L level to the H level of said inverted output signal under control of the inverted output signal of said inverted output node; and a second change speed accelerating circuit connected in parallel with the P-type current mirror circuit of said second current mirror circuit, for accelerating speed of a change from the L level to the H level of said output signal under control of the output signal of said output node.

16. The level shift circuit of claim 15, wherein said first change speed accelerating circuit comprises:

a first P-type transistor connected in parallel with the P-type current mirror circuit of said first current mirror circuit; and a first buffer circuit whose output side is connected to the gate electrode of said first P-type transistor and which is controlled by an inverted output signal of said inverted output node, and said second change speed accelerating circuit includes:

a second P-type transistor connected in parallel with the P-type current mirror circuit of said second current mirror circuit; and a second buffer circuit whose output side is connected to the gate electrode of said second P-type transistor and which is controlled by an output signal of said output node.

17. The level shift circuit of claim 16, wherein said first change speed accelerating circuit further comprises a first control circuit for allowing operation of said first buffer circuit to be performed after a change in the output signal of said output node is finished and said second change speed accelerating circuit further comprises a second control circuit for allowing operation of said second buffer circuit to be performed after a change in the inverted output signal of said inverted output node is finished.

18. The level shift circuit of claim 11, further comprising a stabilizing circuit for determining and stabilizing a potential state of said output node and said inverted output node early in a initial state in which a power source starts to be supplied.

19. The level shift circuit of claim 18, wherein said stabilizing circuit has: a first N-type transistor whose gate electrode is connected to said output node, whose drain electrode is connected to said inverted output node, and whose source electrode is grounded; and a second N-type transistor whose gate electrode is connected to said inverted output node, whose drain electrode is connected to said output node, and whose source electrode is grounded.

20. The level shift circuit of claim 11, wherein at least one of an output signal of said output node and an inverted output signal of said inverted output node is output to the outside.

* * * * *